United States Patent
Ito

(10) Patent No.: US 7,371,434 B2
(45) Date of Patent: May 13, 2008

(54) LIQUID FILM FORMING METHOD AND SOLID FILM FORMING METHOD

(75) Inventor: Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 92 days.

(21) Appl. No.: 10/202,657

(22) Filed: Jul. 25, 2002

(65) Prior Publication Data

US 2003/0072886 A1   Apr. 17, 2003

(30) Foreign Application Priority Data

Jul. 26, 2001 (JP) ............................. 2001-226471
Nov. 1, 2001 (JP) ............................. 2001-336968

(51) Int. Cl.
*B05D 1/02* (2006.01)

(52) U.S. Cl. ....................... 427/425; 427/240; 118/321

(58) Field of Classification Search ................ 427/240, 427/425, 346, 345, 350, 355, 300; 118/52, 118/320; 438/780, 782
See application file for complete search history.

(56) References Cited

U.S. PATENT DOCUMENTS

| | | | |
|---|---|---|---|
| 5,658,615 A | 8/1997 | Hasebe et al. | |
| 5,942,035 A | 8/1999 | Hasebe et al. | |
| 6,063,190 A | 5/2000 | Hasebe et al. | |
| 6,191,053 B1 | 2/2001 | Chun et al. ................ | 438/780 |
| 6,371,667 B1 * | 4/2002 | Kitano et al. ............... | 396/611 |
| 6,407,009 B1 * | 6/2002 | You et al. .................... | 438/782 |
| 6,416,583 B1 * | 7/2002 | Kitano et al. ............... | 118/680 |
| 6,506,453 B2 * | 1/2003 | Ema et al. ................... | 427/424 |
| 6,634,806 B2 * | 10/2003 | Toshima et al. ............ | 396/611 |
| 2001/0039117 A1 * | 11/2001 | Ito et al. ..................... | 438/689 |
| 2003/0072886 A1 * | 4/2003 | Ito .............................. | 427/346 |

FOREIGN PATENT DOCUMENTS

| | | |
|---|---|---|
| CN | 1102505 A | 5/1995 |
| EP | 1205258 A1 | 5/2002 |

(Continued)

OTHER PUBLICATIONS

Webster's Third New International Dictionary. Merriam-Webster Inc. Monotone, Monotonic, Monotonous.*

(Continued)

*Primary Examiner*—Timothy Meeks
*Assistant Examiner*—David Turocy
(74) *Attorney, Agent, or Firm*—Finnegan, Henderson, Farabow, Garrett & Dunner, L.L.P.

(57) ABSTRACT

A method of forming a liquid film characterized by dropping a liquid on a substrate from a dropping unit while rotating the substrate, moving the dropping unit in the radial direction from the inner periphery of the substrate to the outer periphery of the substrate so that the move pitch of the dropping unit in the radial direction occurring in every revolution of the substrate may change slightly, and forming a liquid film on the substrate by adjusting the feed speed of the liquid to the substrate from the dropping unit, while lowering the rotational frequency of the substrate gradually, so that the liquid on the substrate may not move due to centrifugal force by rotation of the substrate, along with the move of the dropping unit in the radial direction of the substrate.

15 Claims, 15 Drawing Sheets

FOREIGN PATENT DOCUMENTS

| | | |
|---|---|---|
| JP | 2-220428 | 9/1990 |
| JP | 6-151295 | 5/1994 |
| JP | 7-321001 | 12/1995 |
| JP | 09-010657 | 1/1997 |
| JP | 2000-77326 | 3/2000 |
| JP | 2000-350955 | 12/2000 |
| JP | 2001-113217 | 4/2001 |
| WO | WO 01/08814 A1 | 2/2001 |

OTHER PUBLICATIONS

"Geometric Progression", Merriam-Webster Online, p. 1.*
Calculate, http://dictionary.reference.com/browse/calculate.*

* cited by examiner

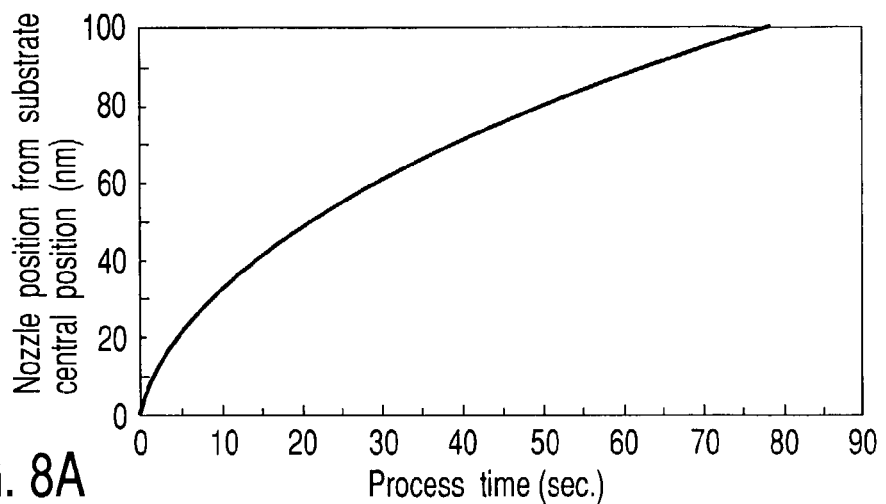
F I G. 8A
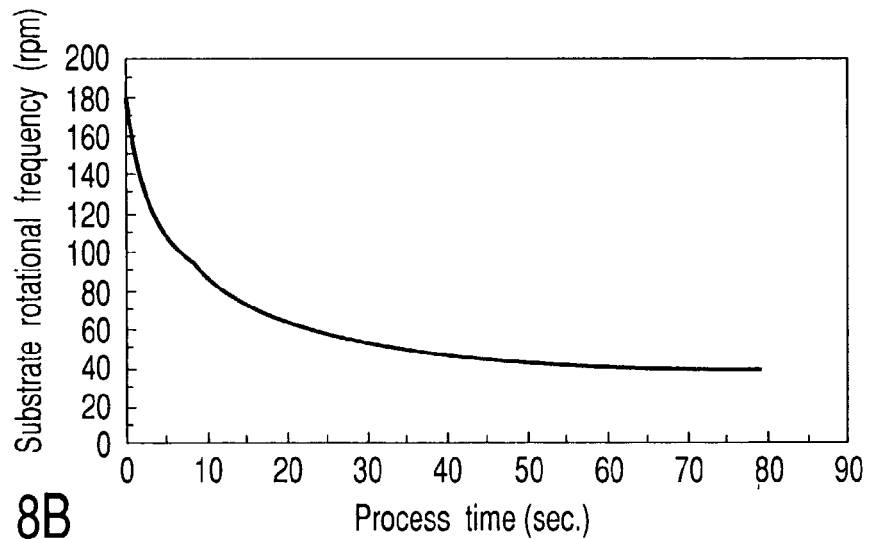
F I G. 8B
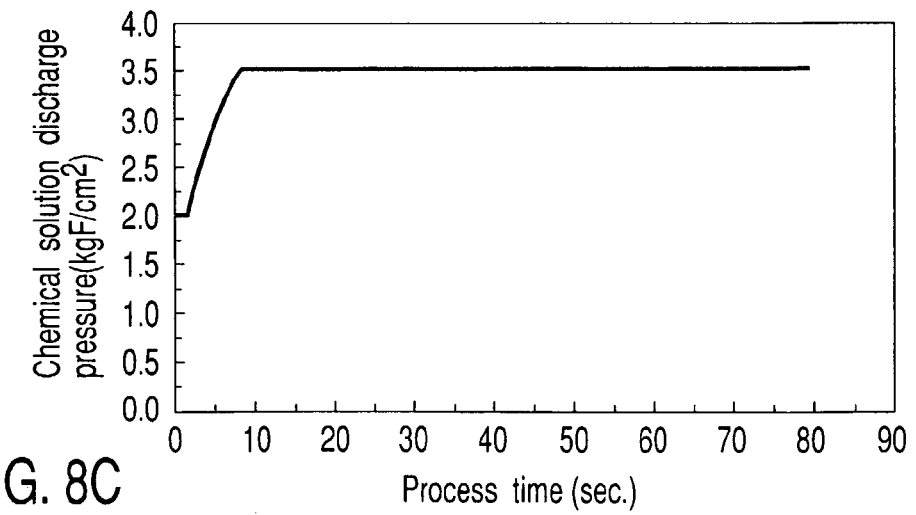
F I G. 8C

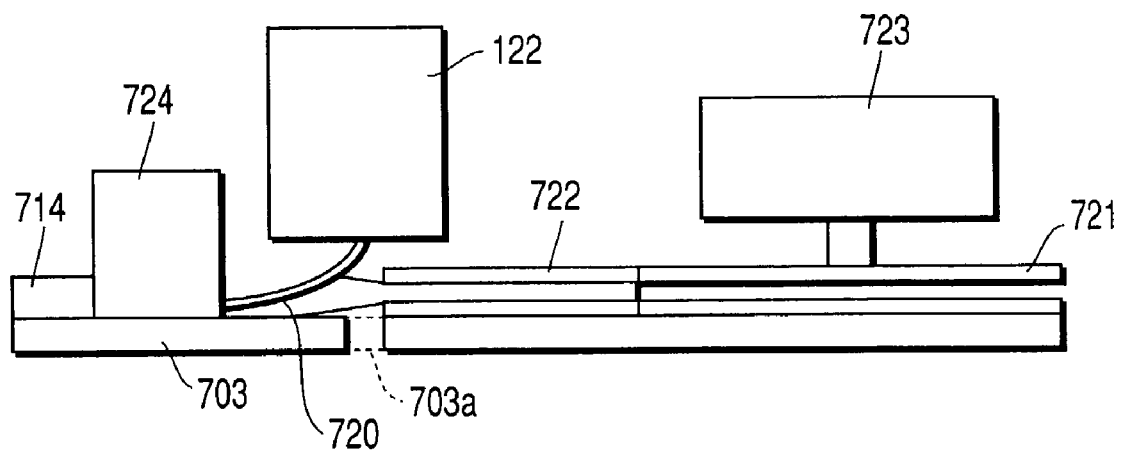
F I G. 13A
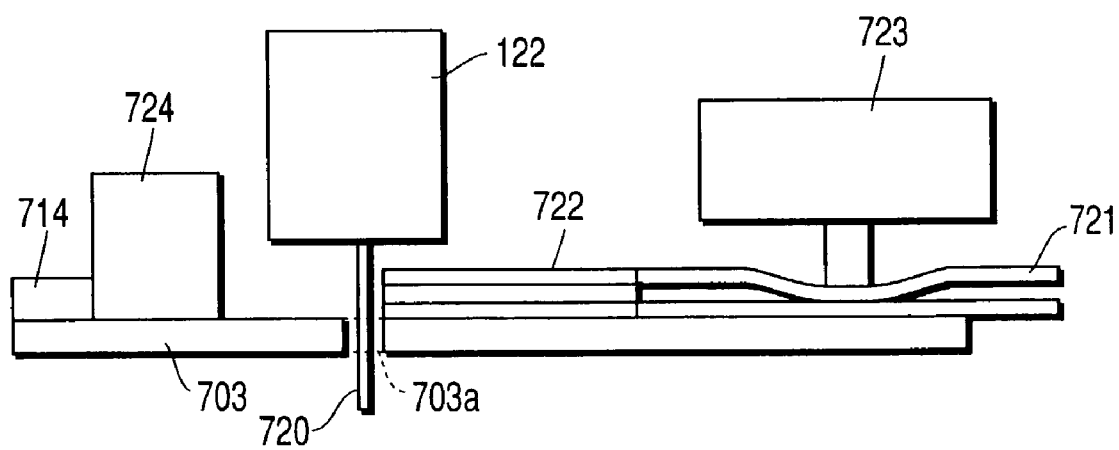
F I G. 13B

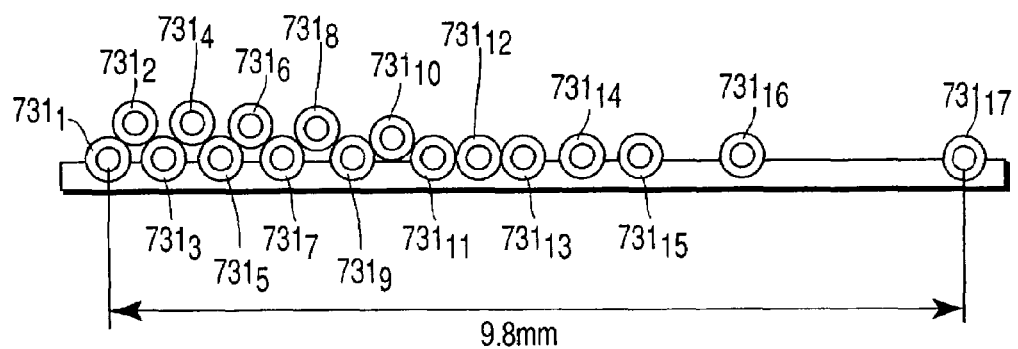
F I G. 16
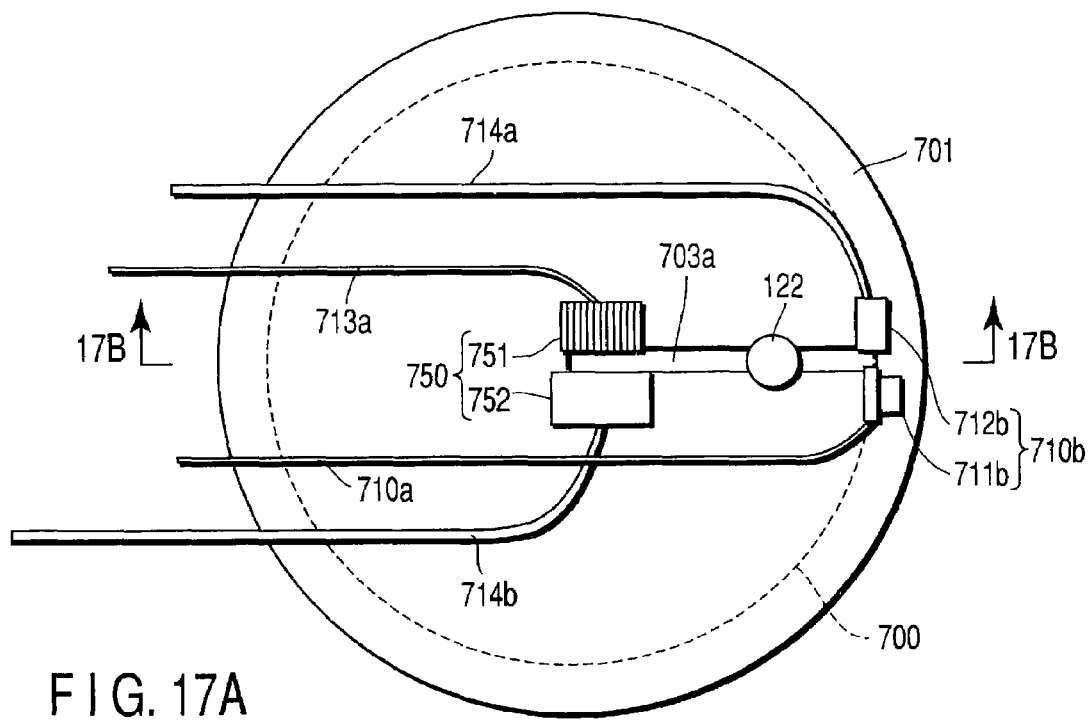
F I G. 17A
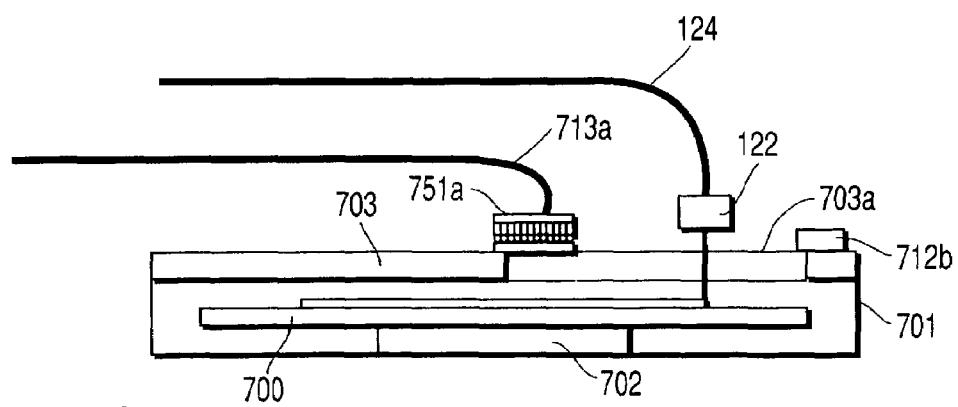
F I G. 17B

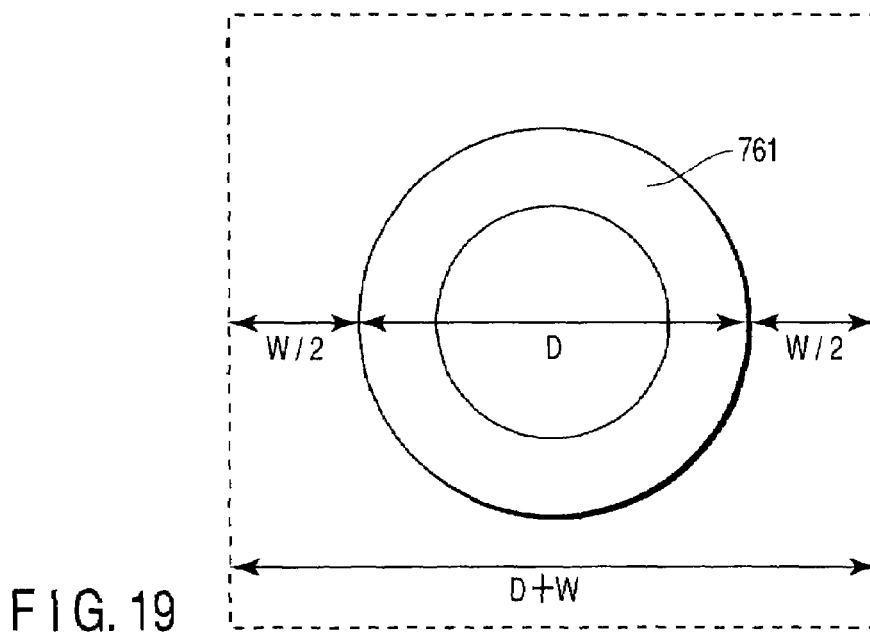
F I G. 19
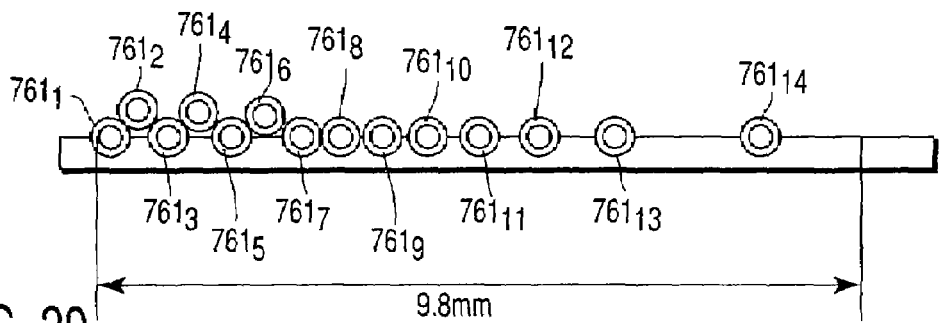
F I G. 20
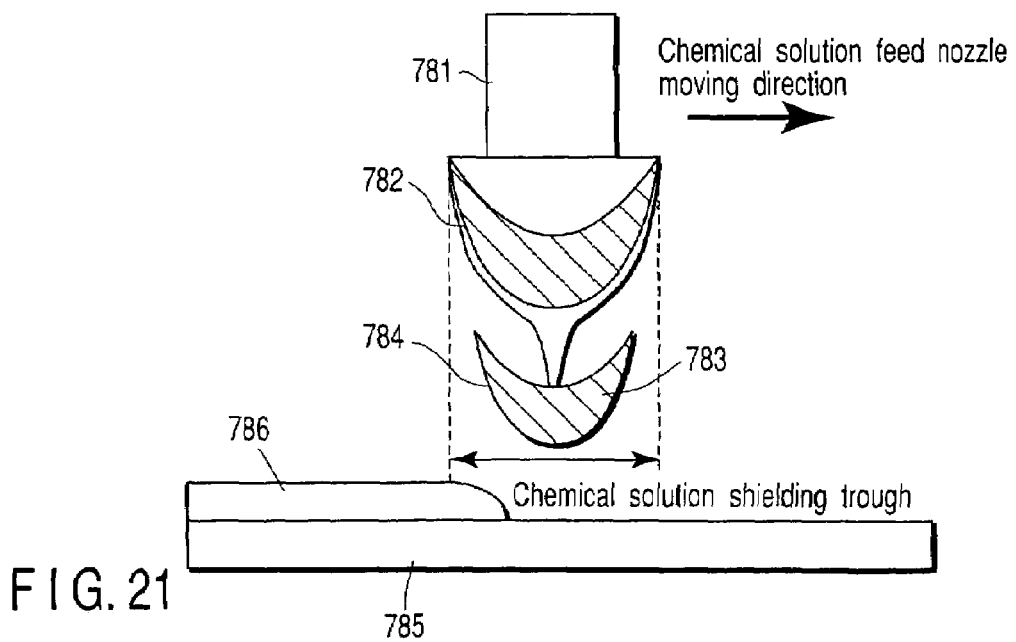
F I G. 21

LIQUID FILM FORMING METHOD AND SOLID FILM FORMING METHOD

CROSS-REFERENCE TO RELATED APPLICATIONS

This application is based upon and claims the benefit of priority from the prior Japanese Patent Applications No. 2001-226471, filed Jul. 26, 2001; and No. 2001-336968, filed Nov. 1, 2001, the entire contents of both of which are incorporated herein by reference.

BACKGROUND OF THE INVENTION

1. Field of the Invention

The present invention relates to a liquid film forming method for forming a film by spirally dropping liquid on a substrate, and a method of forming a solid film using the same.

2. Description of the Related Art

In the spin coating method hitherto employed in the lithographic process, most of the liquid dropped on a substrate is discharged outside of the substrate. Only several percent of the liquid supplied on the substrate is actually used for forming a film, and the most liquid is wasted. Besides, much chemical solution is discharged, and it has adverse effects on the environments. Further, in a square substrate or a circular substrate of large diameter of 12 inches or more, an air turbulence occurs on the periphery of the substrate, and the film thickness is not uniform on the peripheral portion.

A technology for applying uniformly on the entire surface of the substrate without wasting chemical liquid is disclosed in Jpn. Pat. Appln. KOKAI Publication No. 2-220428. This publication teaches a method of dropping a resist liquid from multiple nozzles arranged in a row, and blowing gas or liquid to the film forming surface from behind, thereby obtaining a uniform film.

Jpn. Pat. Appln. KOKAI Publication No. 6-151295 discloses a technology intended to obtain a uniform film by dropping a resist liquid on a substrate. This publication teaches a method of spraying a chemical solution to the substrate from multiple injection ports provided in a bar.

Jpn. Pat. Appln. KOKAI Publication No. 7-321001 discloses a technology of coating while moving relatively with the substrate, by using a spray head having multiple jet holes for spraying a resist liquid.

In these application apparatuses, it is commonly intended to form a uniform film by arranging plural dropping or spraying nozzles in a row, and scanning them along the substrate surface.

Aside from these coating methods of using the apparatus having plural nozzles, a method of forming a liquid film by using one liquid discharge nozzle and scanning on the substrate is also proposed. In this method, however, the processing time per substrate may be very long depending on the nozzle operating technique, or the consumption of chemical solution may be notably increased.

In order to solve these problems, a technique of applying by spirally supplying the chemical solution is disclosed in Jpn. Pat. Appln. KOKAI Publication No. 2000-77326. In this method, "it is preferred to apply, as the coating condition, by moving the nozzle unit in the wafer diametral direction (for example, X-direction) while rotating the wafer at low frequency (for example, 20 to 30 rpm). It is also important to "keep constant the relative speed of the wafer and nozzle unit." That is, it is defined that the linear speed of the nozzle should be constant.

When moving the nozzle unit at a constant speed, to make the linear speed constant, the rotational frequency at the inner side should be higher than at the nozzle periphery. For example, in the case of a wafer of diameter of 200 mm, even if the rotational frequency is 30 rpm at radius of 100 mm, the rotational frequency is proportional to the reciprocal number of the diameter, and in the portion of radius of 1 mm or less, the rotational frequency must be 3000 rpm or more. While the wafer is rotating at 3000 rpm, even if liquid application is started from the center of the substrate, the chemical solution is instantly discharged outside of the substrate.

When the wafer is rotated at a constant low frequency, the nozzle moving speed in the center of the substrate is extremely fast. Even if the liquid is moved by applying vibration after application, the nozzle is not moved sufficiently, and the chemical solution is not applied in a central area. As a result, a uniform film cannot be formed. Thus, when the chemical solution is discharged while keeping the linear speed constant, a liquid film of uniform thickness cannot be formed.

BRIEF SUMMARY OF THE INVENTION

According to one aspect of the present invention, there is provided a method of forming a liquid film comprising:

preparing a substrate; and forming a liquid film on the substrate by dropping a liquid on a substrate from a dropping unit while rotating the substrate, moving the dropping unit in the radial direction from the inner periphery of the substrate to the outer periphery of the substrate so that the move pitch of the dropping unit in the radial direction occurring in every revolution of the substrate may change slightly, and adjusting the feed speed of the liquid to the substrate from the dropping unit, while lowering the rotational frequency of the substrate gradually, so that the liquid on the substrate may not move due to centrifugal force by rotation of the substrate, along with the move of the dropping unit in the radial direction of the substrate.

According to another aspect of the present invention, there is provided a method of forming a solid film comprising:

forming a liquid film on a substrate by dropping a liquid including the solvent on a substrate from a dropping unit while rotating the substrate, moving the dropping unit in the radial direction from the inner periphery of the substrate to the outer periphery of the substrate so that the move pitch of the dropping unit in the radial direction occurring in every revolution of the substrate may change slightly, and adjusting the feed speed of the liquid to the substrate from the dropping unit, while lowering the rotational frequency of the substrate gradually, so that the liquid on the substrate may not move due to centrifugal force by rotation of the substrate, along with the move of the dropping unit in the radial direction of the substrate, and forming a solid layer by drying and removing the solvent by exposing the substrate on which the film is formed to a pressure below the vapor pressure at the treating temperature of the solvent in the liquid film.

According to still another aspect of the present invention, there is provided a method of forming a liquid film comprising:

setting a first position at one end of moving section of a dropping unit for dropping a chemical solution while moving in a radial direction on a rotating substrate, determining a chemical solution feed amount $q_0$ per unit length at the rotational frequency of the substrate when the dropping unit is positioned on the outermost diameter of the chemical solution supply region of the substrate and on the trajectory of the chemical solution dropped on the substrate from the dropping unit to the substrate, setting the move pitch so that the move pitch of the dropping unit in the radial direction occurring at every revolution of the substrate may change when the dropping unit is present at an arbitrary position, determining the chemical solution feed speed and substrate rotational frequency from the dropping unit at the first position, from the first position, the move pitch of the dropping unit at the first position, and the chemical solution feed amount $q_0$, determining the second position of the dropping unit located in unit time from the rotational angle when the substrate is rotated for unit time from the time of the dropping unit located at the first position, and the move pitch of the dropping unit at the first position, determining the relation of the radial position of the dropping unit, chemical solution feed speed, and substrate rotational frequency with respect to the time, by setting the second position again as a new first position until the second position reaches other end of the moving section, and repeating determination of the chemical solution feed speed and substrate rotational frequency from the dropping unit at the first position and determination of the second position where the dropping unit is located in unit time, and forming a liquid film on the substrate by controlling the radial position of the dropping unit, chemical solution feed speed, and substrate rotational frequency on the basis of the determined relation.

According to still another aspect of the present invention, there is provided a liquid film forming apparatus comprising:

a substrate-mounting platform on which a substrate is mounted and having a rotary drive system, a circular columnar processing chamber enclosing the substrate, a dropping unit for discharging a liquid continuously to the substrate, a dropping unit drive mechanism for moving the dropping unit in the radial direction of the substrate, a top plate disposed between the dropping unit and the substrate, and provided with a slit for passing the chemical solution discharged from the dropping unit, and a plurality of chemical solution partial shielding mechanisms disposed between the top plate and the dropping unit, depending on the chemical solution-shielding rate in the radial direction of the substrate.

BRIEF DESCRIPTION OF THE SEVERAL VIEWS OF THE DRAWING

FIG. 8A is a graph showing the nozzle position from the center of the substrate with respect to the process time according to the second embodiment;

FIG. 8B is a graph showing the substrate rotational frequency with respect to the process time according to the second embodiment;

FIG. 8C is a graph showing the chemical solution discharge pressure with respect to the process time according to the second embodiment;

FIGS. 13A and 13B are diagrams schematically showing a configuration of a chemical solution shielding mechanism according to the fifth embodiment;

FIG. 16 is a diagram showing an arrangement of gas injection nozzles of a chemical solution partial shielding mechanism compiled on the basis of the gas injection nozzle central position and effective width in Table 1;

FIGS. 17A and 17B are diagrams schematically showing a configuration of an application apparatus comprising a chemical solution partial shielding mechanism;

FIG. 19 is a diagram showing an example of an arrangement of a gas injection nozzle in the middle of shielding unit;

FIG. 20 is a diagram showing a configuration of gas injection nozzles arranged at the layouts shown in Table 2; and FIG. 21 is a diagram showing a schematic configuration of a chemical solution partial shielding mechanism composed of downspouts arranged in an upper layer and a lower layer thereof.

DETAILED DESCRIPTION OF THE INVENTION

Figure 1:
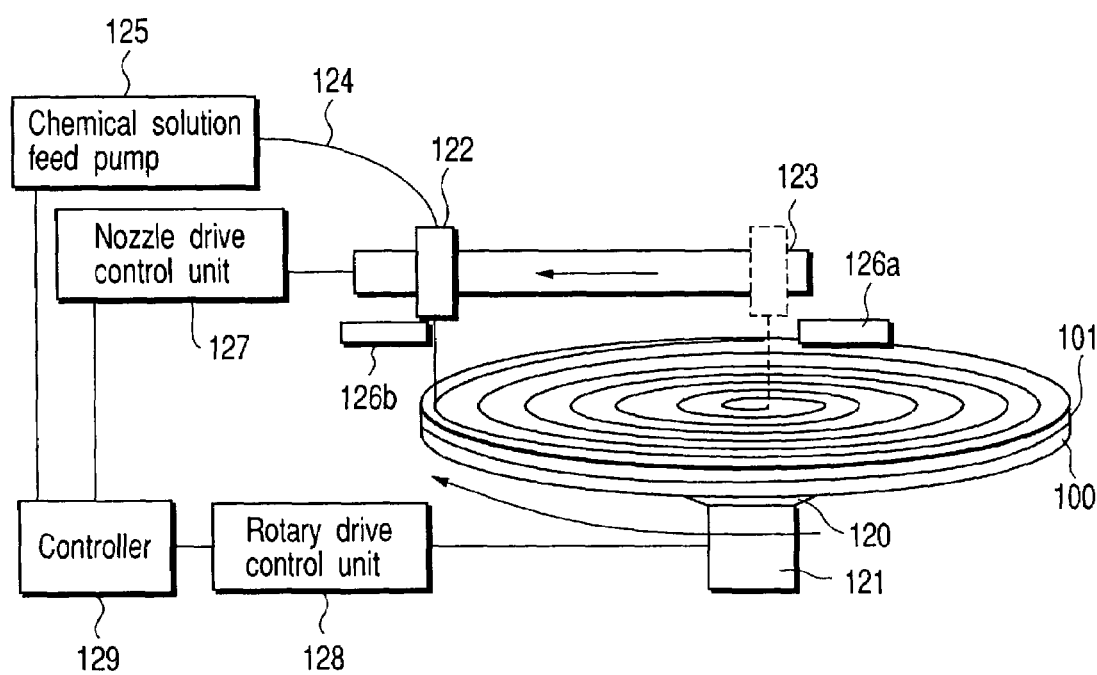
FIG. 1 is a diagram schematically showing a configuration of a film forming apparatus according to a first embodiment of the present invention.

Referring now to the drawings, preferred embodiments of the invention will be described in detail below.

First Embodiment

FIG. 1 is a block diagrams showing a schematic configuration of a film forming apparatus to be used in the present invention.

As shown in FIG. 1, a substrate 100 is placed on a substrate holder 120, which is connected to a drive system 121 rotating about the center of the substrate 100. Above the substrate 100, a chemical solution feed nozzle (dropping unit) 122 is disposed. The chemical solution feed nozzle 122 discharges a chemical solution on the substrate 100. A nozzle drive system 123 moves the chemical solution feed nozzle 122 in the substrate radial direction. A chemical solution feed pump 125 is connected to the chemical solution feed nozzle 122 by way of a chemical solution feed pipe 124. The chemical solution is discharged from the chemical solution feed nozzle 122 by the action of the chemical solution feed pump 125. The discharge speed of the chemical solution discharged from the chemical solution feed nozzle 122 is controlled by regulating the chemical solution feed pressure from the chemical solution feed pump 125.

Figure 2:
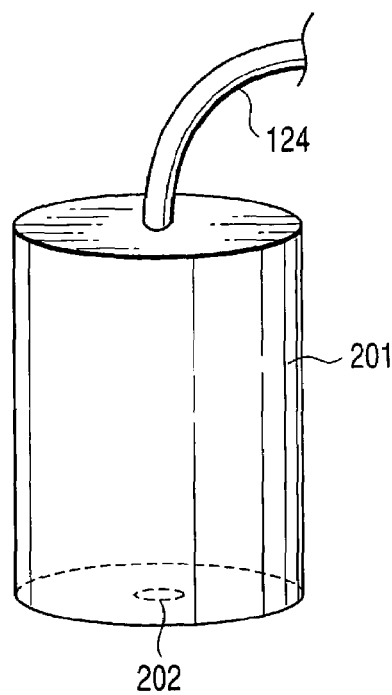
FIG. 2 is a diagram schematically showing a configuration of a chemical solution feed nozzle for composing the film forming apparatus shown in FIG. 1.

The chemical solution feed nozzle 122 is composed, for example, as shown in FIG. 2. As shown in FIG. 2, the chemical solution feed nozzle 122 comprises a chemical solution tank 201 for temporarily storing the chemical solution supplied from the chemical solution feed pipe 124 connected to the chemical solution feed pump (not shown), and a chemical solution discharge port 202 for discharging the chemical solution from the chemical solution tank 201.

The chemical solution feed nozzle 122 starts to move from nearly the center of the substrate 100 by the action of the nozzle drive system 123, and moves almost to the edge of the substrate 100 while continuously supplying the chemical solution on the substrate 100. The chemical solution feed ends at the time when the chemical solution feed nozzle reaches the edge of the substrate 100. At the move start position and move end position of the chemical solution feed nozzle, chemical solution shielding mechanisms 126a, 126b are provided. These chemical solution shielding mechanisms 126a, 126b are designed so as to shield the chemical solution discharged from the chemical solution feed nozzle 122. The chemical solution shielding mechanism 126a at the move start position prevents the chemical solution from reaching the substrate 100 until the rotational frequency of the substrate holder 120, the moving speed of the nozzle drive system 123, and the chemical solution discharge speed from the chemical solution feed nozzle 122 reach the specified values necessary at the time of start of application. The chemical solution shielding mechanism 126b at the move end position waits in the space above the edge of the substrate 100 so that the chemical solution may not be supplied to the edge of the substrate 100. The chemical solution shielding mechanism 126b also prevents the chemical solution from reaching the substrate 100 when the chemical solution feed nozzle 122 comes to the edge of the substrate 100.

While the chemical solution is being supplied on the substrate 100, the rotational frequency of the substrate holder 120, the moving speed of the nozzle drive system 123, and the chemical solution discharge speed from the chemical solution feed nozzle 122 are controlled, respectively, by a rotary drive control unit 128, a nozzle drive control unit 127, and the chemical solution feed pump 125. A controller 129 for supervising the three control units 125, 127, 128 is disposed at the upstream position.

The controller 129 determines the rotational frequency of the rotary drive control unit 128, the nozzle drive speed, and the chemical solution discharge speed on the basis of positional information on the substrate 100 of the chemical solution feed nozzle 122. The controller 129 commands the rotating speed, nozzle drive speed and chemical solution discharge speed to the rotary drive control unit 128, nozzle drive control unit 127, and chemical solution feed pump 125. On the basis of this command, the rotary drive control unit 128, nozzle drive control unit 127, and chemical solution feed pump 125 are put in operation, so that the chemical solution is spirally supplied on the substrate 100. The chemical solution supplied on the substrate 100 spreads widely, and is bonded with an adjacent liquid film, and forms one liquid film 101 on the substrate 100.

After the liquid film 101 is formed, a step of drying and removing the solvent in the liquid film is carried out on the substrate 100. As a drying method, a method is used such as heating, drying under reduced pressure of not more than saturated vapor pressure of the solvent, and exposing the surface to air flow.

An example of application of this liquid film forming means in ArF photosensitive resin film forming of film thickness of 400 nm is explained below. The photosensitive resin solution has a solid content of 3%. On the substrate, an anti-reflection film for canceling the reflected light from the substrate surface at the time of ArF exposure was formed in the following procedure.

For the ease of understanding of the explanation, the translation drive direction of the substrate holder 120 including the diameter of the substrate 100 is supposed to be the X-axis, and the trajectory of the discharge port when the chemical solution feed nozzle 122 orthogonal thereto is driven is supposed to be the Y-axis. The center of the circular substrate is called the origin of the substrate. The apparatus reference point is the origin (0, 0) of the XY coordinate system, and the position is indicated in the unit of mm.

Figure 3:
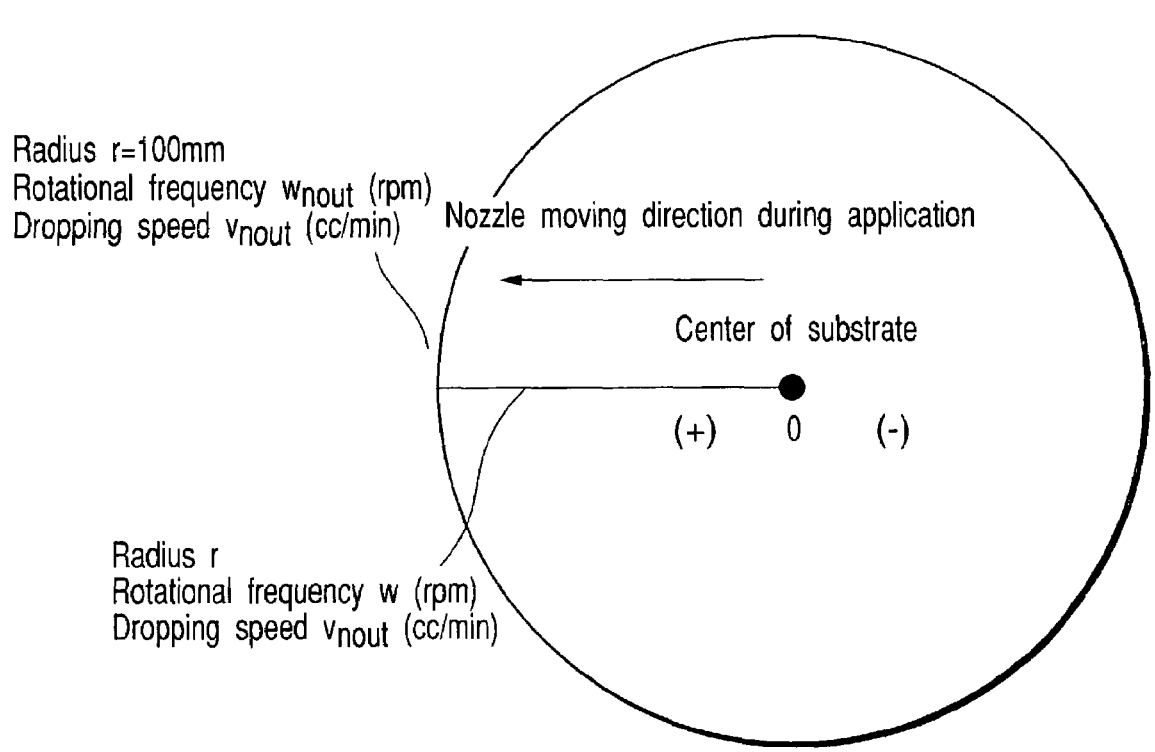
FIG. 3 is a plan view showing the nozzle moving direction when feeding the chemical solution.

Hereinafter, as shown in FIG. 3, the movement in the same direction as the nozzle moving direction when feeding the chemical solution is supposed to be the + axis, and the movement in the opposite direction is explained as the − axis.

As the trajectory of the nozzle, every time the substrate makes one revolution, the radial direction nozzle move pitch change rate "a" is supposed to be 0.99 (1% decrement). From the drop of the chemical solution on the substrate, the rotational frequency of the substrate is defined to be a known value n (a real number of n>0). At the known value n, the radial direction nozzle move pitch $d_n$ is expressed as follows:

$$d_n = d_1 \times a^{n-1} \quad (1)$$
$$= d_1 \times 0.99^{n-1} \quad (2)$$

where $d_1$ is the nozzle move pitch at the known value of n=1.

At this time, the nozzle radial position $R_n$ is expressed as follows:

$$R_n = d_1 \times (1-a)^{n-1} / (1-a) \quad (3)$$
$$= d_1 \times (1-0.99)^{n-1} / (1-0.99) \quad (4)$$

Without allowing the chemical solution to be discharged outside of the substrate, the condition capable of forming a liquid film without deviation of liquid film distribution within the substrate plane is explained. First is explained the condition when the radial direction nozzle move pitch $d_n$ is not changed (a=1), being followed by the condition when the radial direction nozzle move pitch $d_n$ is changed.

When the radial direction nozzle move pitch $d_n$ is constant (a=1), the change rate of the area (S) at radius r is $2\pi r$. The chemical solution feed amount q per spiral unit length to the substrate in the radial direction r is:

$$q = q_{nout} \cdot r/r_{out} \quad (5)$$

where $r_{out}$ is the outermost diameter of supply of chemical solution, and $q_{nout}$ is the chemical solution feed amount per spiral unit length to the substrate at the chemical solution feed outermost diameter $r_{out}$.

Among the chemical solution feed speed $v_n$ (cc/min) at distance r from the center of the substrate, the substrate rotational frequency $w_n$ (rpm), and the chemical solution feed amount q, the relation of the following formula (6) is established.

$$q = v_n / w_n \quad (6)$$

Therefore, from the formulas (5) and (6), the chemical solution feed speed $v_n$ at distance r from the center of the substrate and the substrate rotational frequency $w_n$ may be determined to satisfy the following formula (7).

$$\frac{V_n}{W_n} = \frac{V_{nout}}{W_{nout}} \times \frac{r}{r_{out}} \quad (7)$$

At this time, the chemical solution feed speed $v_n$ and substrate rotational frequency $w_n$ may be determined in any one of the following three methods.

(I) To determine the discharge amount of chemical solution and rotational frequency of the substrate depending on the radial position of the chemical solution feed nozzle ($r/r_{out}$).

(II) To determine the rotational frequency of the substrate depending on the radial position of the chemical solution feed nozzle ($r/r_{out}$) (the discharge amount is almost constant).

(III) To determine the chemical solution discharge amount depending on the radial position of the chemical solution feed nozzle ($r/r_{out}$) (the rotational frequency is almost constant).

First, the determination of the chemical solution feed speed $v_n$ and substrate rotational frequency $w_n$ according to the method (I) is explained.

The chemical solution feed speed $v_n$ and substrate rotational frequency $w_n$ at distance r can be expressed by using coefficient b as shown in the following formulas (8) and (9).

$$V_n = V_{nout} \times \frac{b}{(r_{out}/r)^{1/2}} \quad (8)$$

$$W_n = W_{nout} \times b \times (r_{out}/r)^{1/2} \quad (9)$$

On other hand, the centrifugal force F to be applied on the liquid film in a small unit area at distance r from the center of the substrate is expressed as follows:

$$F = m r w_n^2 \quad (10)$$
$$= c q_n r w_n^2$$
$$= c \times \frac{q_{nout} r / r_{out}}{2\pi r} \times r w_n^2$$
$$= \frac{c q_{nout}}{2\pi} \times \frac{r}{r_{out}} \times w_n^2$$

where c is the specific gravity of the liquid.

The relation between the value of r when the centrifugal force F is constant and the substrate rotational frequency $w_n$ is determined as follows.

$$W_n = \frac{(F/C)^{1/2}}{(r_{out}/r)^{1/2}} \quad (11)$$

$$C = c \frac{q_{nout}}{2\pi r_{out}}$$

From the formulas (9) and (11), the substrate rotational frequency $w_{nout}$ at radius $r_{out}$ is determined as follows by using the centrifugal force F at the lower limit of causing flowability in the wide spread liquid film, and coefficient C and coefficient b (usually 1).

$$w_{nout} \leq (F/C)^{1/2} \times b \quad (12)$$

By feeding the chemical solution in the condition of satisfying the condition of the formula (12), the chemical solution is not discharged outside of the substrate. It is thus possible to form a liquid film free from deviation in the liquid film distribution within the substrate plane. Incidentally, the values of the substrate rotational frequency $w_n$ and the chemical solution feed speed $v_n$ to the substrate may be changed to any values as far as the combination satisfy the formula (6) and formula (13) below.

$$W_n \leq \frac{(F/C)}{(r_{out}/r)^{1/2}} \quad (13)$$

In the embodiment, the radial direction nozzle move pitch $d_n$ is not constant, but varies in geometrical series. Hence, the formulas (8) and (9) may be rewritten respectively as follows.

$$v_n = \frac{v_{nout}}{(r_{out}/r)^{1/2}} \times b \times \left(\frac{R_{n+0.5} - R_{n-0.5}}{R_{nout+0.5} - R_{nout-0.5}}\right)^{1/2} \quad (8')$$

$$w_n = \frac{w_{nout}}{(r_{out}/r)^{1/2}} \times b \times \left(\frac{R_{n+0.5} - R_{n-0.5}}{R_{nout+0.5} - R_{nout-0.5}}\right)^{-1/2} \quad (9')$$

Using the formulas (8') and (9'), and adjusting to the centrifugal force F so as not to cause flowability in the wide spread liquid film, the object of the invention can be achieved.

Next, by the method of (II), the following is to explain the determination of the chemical solution feed speed $v_n$ and substrate rotational frequency $w_n$.

Using the coefficient b (usually 1), the chemical solution feed speed $v_n$ and substrate rotational frequency $w_n$ at distance r are expressed as follows.

$$v_n = v_{nout} \times b \quad (14)$$

$$w_n = w_{nout} \times \frac{r_{out}}{r} \times b \quad (15)$$

The formulas (14) and (15) denote values when the radial direction nozzle pitch is constant at every revolution of the substrate. In this embodiment, the radial direction nozzle move pitch $d_n$ is not constant, but varies in geometrical series. Hence, the formulas (14) and (15) may be replaced respectively by:

$$v_n = v_{out} \times b \times \sqrt{\frac{R_{n+0.5} - R_{n-0.5}}{R_{nout+0.5} - R_{nout-0.5}}} \quad (16)$$

$$w_n = w_{nout} \times b \times \frac{r_{out}/r}{\sqrt{\frac{R_{n+0.5} - R_{n-0.5}}{R_{nout+0.5} - R_{nout-0.5}}}} \quad (17)$$

Using the formulas (16) and (17), and adjusting to the centrifugal force F so as not to cause flowability in the wide spread liquid film, the object of the invention can be achieved.

Next, by the method of (III), the following is to explain the determination of the chemical solution feed speed $v_n$ and substrate rotational frequency $w_n$.

Using the coefficient b (usually 1), the chemical solution feed speed $v_n$ and substrate rotational frequency $w_n$ at distance r are expressed as follows:

$$v_n = v_{nout} \times \frac{b}{r_{out}/r} \quad (18)$$

$$w_n = w_{nout} \times b \quad (19)$$

The formulas (18) and (19) denote values when the radial direction nozzle pitch is constant at every revolution of the substrate. In this embodiment, the radial direction nozzle move pitch $d_n$ is not constant, but varies in geometrical series. Hence, the formulas (18) and (19) may be replaced respectively by:

$$v_n = \frac{v_{nout}}{r_{out}/r} \times b \times \sqrt{\frac{R_{n+0.5} - R_{n-0.5}}{R_{nout+0.5} - R_{nout-0.5}}} \quad (20)$$

$$w_n = \frac{b \times w_{nout}}{\sqrt{\frac{R_{n+0.5} - R_{n-0.5}}{R_{nout+0.5} - R_{nout-0.5}}}} \quad (21)$$

Using the formulas (20) and (21), and adjusting to the centrifugal force F so as not to cause flowability in the wide spread liquid film, the object of the invention can be achieved.

Second Embodiment

This embodiment relates to a method of applying a laser reaction film on a compact disc (CD). Considering process by blue semiconductor laser as laser reaction film, a pigment having an absorption in 400 to 550 nm was dissolved in an organic solvent. The solid matter concentration in the solution was 3%. The coating range of the compact disc is an outside region of 19 mm in diameter from the center (outside diameter 55.4 mm). This substrate was coated in the condition of $d_1=1.5$, $a=0.995$. Assuming the trajectory $S_n$ of the chemical solution feed nozzle to be:

$$r = 1.5 \times \frac{1 - 0.995^{n-1}}{1 - 0.995} \quad (22)$$

the known value n was changed from 14.05282 to 41.72949. In actual application, the relation of the nozzle radial position $R_n$, chemical solution feed speed $v_n$, and substrate rotational frequency $w_n$ with respect to the time must be expressed.

Figure 4:
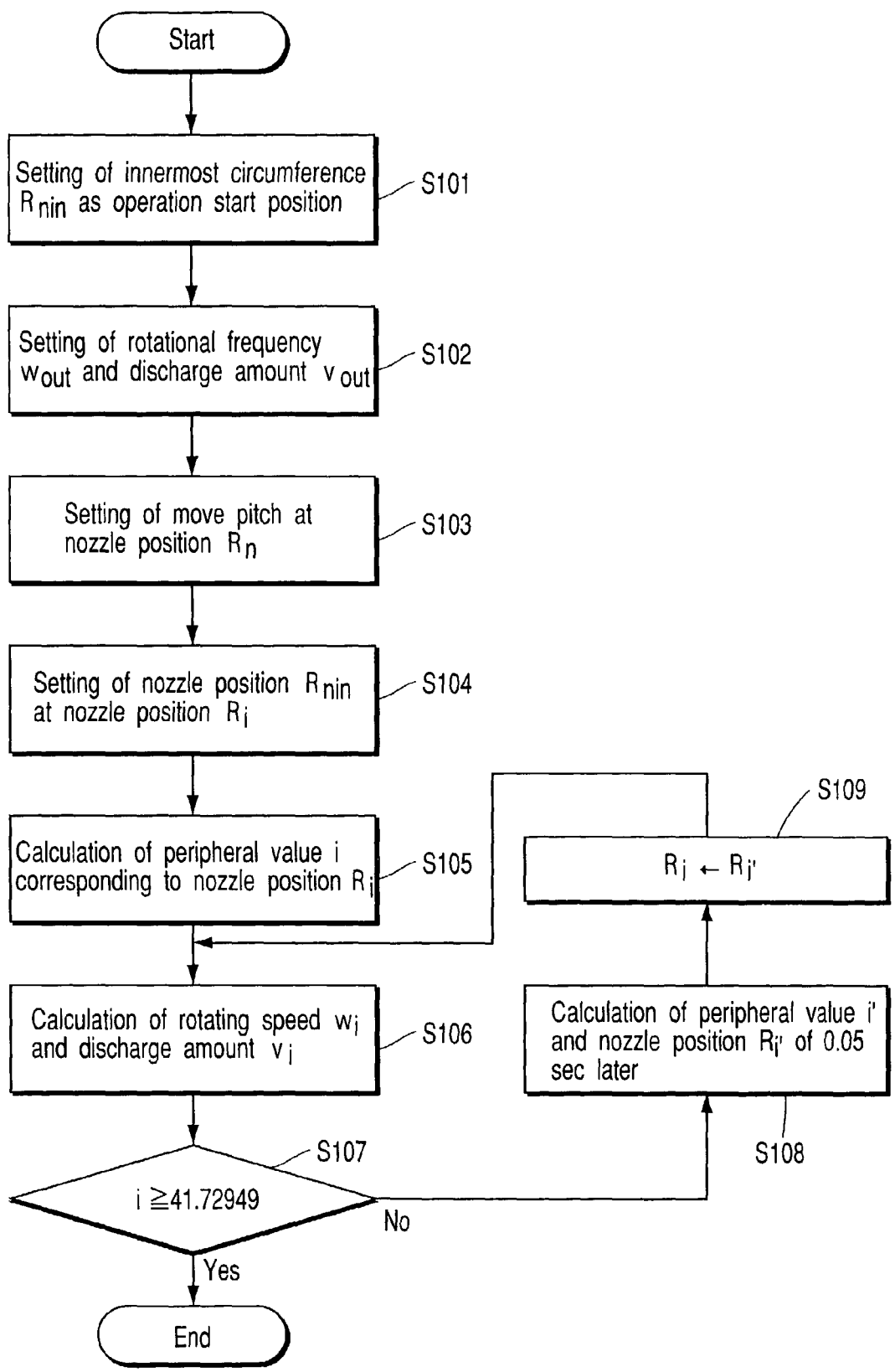
FIG. 4 is a flowchart showing a method of determining the relation of nozzle radial position $R_n$, chemical solution feed speed $v_n$, and substrate rotational frequency $w_n$ with respect to the time according to a second embodiment of the present invention.

This procedure is explained by referring to the flowchart in FIG. 4. FIG. 4 is a flowchart showing a method of determining the relation of the nozzle radial position $R_n$, chemical solution feed speed $v_n$, and substrate rotational frequency $w_n$ with respect to the time according to the first embodiment.

(Step S101)

First, the innermost circumference $R_{min}$ of the substrate is set as an operation start position (first position) in the move section of the chemical solution feed nozzle.

(Step S102)

At $R_{nout}=55.4$, the substrate rotational frequency $w_{nout}=107.6$ rpm and chemical solution discharge pressure (chemical solution feed speed) $v_{nout}$ are set. The rotational frequency and discharge pressure determined herein are adjusted so that the chemical solution may not be discharged outside of the substrate at the time of application.

The method of calculation of the rotational frequency not to cause scattering of the chemical solution on the outer circumference of the substrate is explained. From the stopped state, the rotational frequency is gradually increased at a rate of 1 rpm/sec, and the rotational frequency causing the chemical solution to scatter outside of the substrate is determined.

(Step S103)

The trajectory of the chemical solution feed nozzle in the radial direction, that is, the nozzle move pitch at the nozzle position $R_n$ is set. In this embodiment, the initial term $d_1$ of the geometrical series is 1.5, and the change rate "a" is 0.995.

$$r = 1.5 \times \frac{1 - 0.995^{n-1}}{1 - 0.995} \quad (22)$$

(Step S104)

The nozzle position $R_{nin}$ is set at the nozzle position $R_i$.

The sequence of steps S101 to S104 is not specified, and not limited to the order shown herein.

(Step S105)

Using the set initial term $d_1$, change rate "a" and formula (22), a peripheral value i corresponding to the innermost circumference $R_{nin}$ ($R_{nin}$=19 mm) of a compact disc is determined. In this embodiment, the peripheral value n corresponding to the innermost circumference $R_{nin}$=19 mm of a compact disc was 14.05282.

(Step S106)

Using the substrate rotational frequency $w_{nout}$ and chemical solution discharge pressure $v_{nout}$ at $R_{nout}$=55.4 and the formulas (8') and (9'), the chemical solution discharge pressure $v_i$ ($v_{14.05282}$) and substrate rotational frequency $w_i$ ($w_{14.05282}$) at the peripheral value i (=14.05282) are determined.

On the other hand, peripheral value $n_{out}$ corresponding to the outermost circumference $R_{nout}$ of the substrate is $n_{out}$=41.72949. That is, starting from the position of 19 mm from the center of the substrate, the trajectory of the chemical solution feed nozzle reaches the substrate edge by turning on the substrate by 27.6767 revolutions.

(Step S107)

It is determined whether or not the peripheral value i satisfies the condition of i≧41.72949. If determined that i≧41.72949 is determined, step S108 is executed.

(Step S108)

Determining the peripheral value Δi changing in 0.05 sec (unit time), a peripheral value i'=i+Δi after 0.05 sec is obtained. A chemical solution feed nozzle radial position $R_{i'}$ corresponding to the obtained peripheral value i' is calculated.

While the substrate is rotating at rotational frequency of $w_n$ at time t sec, from time t sec to time t+0.05 sec, the substrate rotates by Δn=$w_n$/60×0.05 (revolutions).

This is explained by referring to a specific example. Assuming the substrate rotational frequency to be $w_{14.05282}$=180 rpm, the substrate rotates by 0.15 revolution in 0.05 sec. Therefore, after rotating for 0.05 sec at substrate rotational frequency of $w_{14.05282}$, the peripheral value n is n'=14.05282+0.15=14.20282. The value of $R_{14.20282}$ corresponding to n'=14.20282 is $R_{14.20282}$=19.2112 [mm] from the formula (22).

(Step S109)

The nozzle position $R_{i'}$ (second position) after 0.05 sec is set again newly as $R_i$ (first position).

(Step S106)

Using the substrate rotational frequency $w_{nout}$ and chemical solution discharge pressure $v_{nout}$ at $R_{nout}$=55.4 and the formulas (8') and (9'), the chemical solution discharge pressure $v_i$ and substrate rotational frequency $w_i$ at the nozzle position $R_i$ (peripheral value i) are determined.

(Step S107)

Until it is determined to be i≧41.72949, steps S108, S109, and S106 are repeated.

In the procedure explained above, the relation of the radial position of the dropping unit, chemical solution discharge pressure (chemical solution feed speed), and substrate rotational frequency with respect to the time can be determined. From arbitrary time t sec to t+0.05 sec, $R_n$, $v_n$, and $w_n$ are assumed to be constant.

On the basis of the determined relation, the radial position of the chemical solution feed nozzle, chemical solution discharge pressure, and substrate rotational frequency are controlled, and a liquid film is formed on the substrate.

This procedure can be applied as far as there is no contradiction in the device in the innermost circumference. In the apparatus of the embodiment, by controlling the discharge pressure, the chemical solution feed speed is controlled. However, the discharge pressure at the innermost circumference becomes smaller than 2 kgF/cm$^2$ which is the lower limit of controllable pressure range, and it is uncontrollable. In such a case, the chemical solution feed nozzle position, chemical solution feed speed (chemical solution discharge pressure), and substrate rotational frequency with respect to the time can be determined from the outermost circumference of the substrate.

Figure 5:
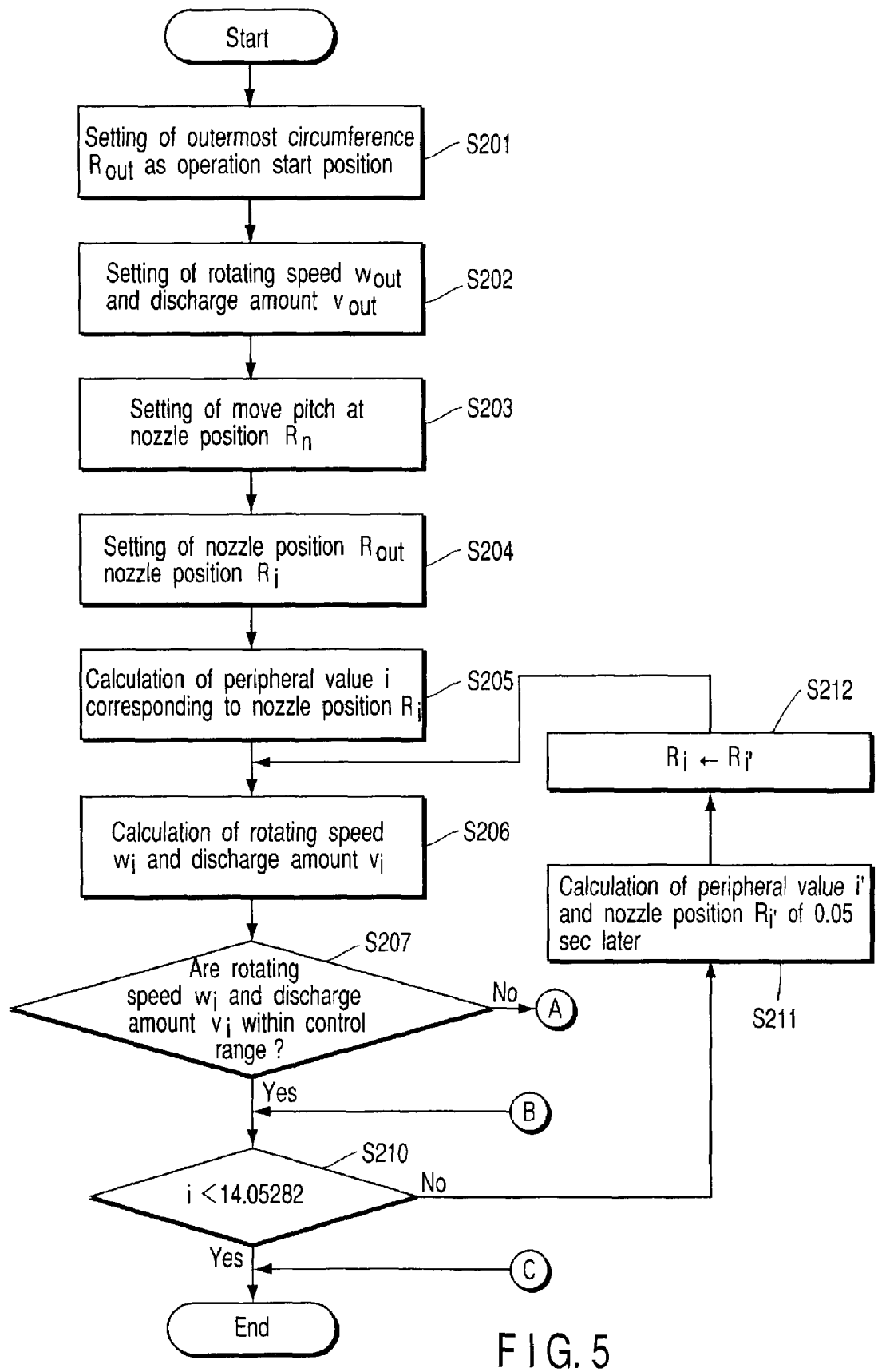
FIG. 5 is a flowchart showing a method of determining the relation of the nozzle radial position $R_n$, chemical solution feed speed $v_n$, and substrate rotational frequency $w_n$ with respect to the time according to the second embodiment.
Figure 6:
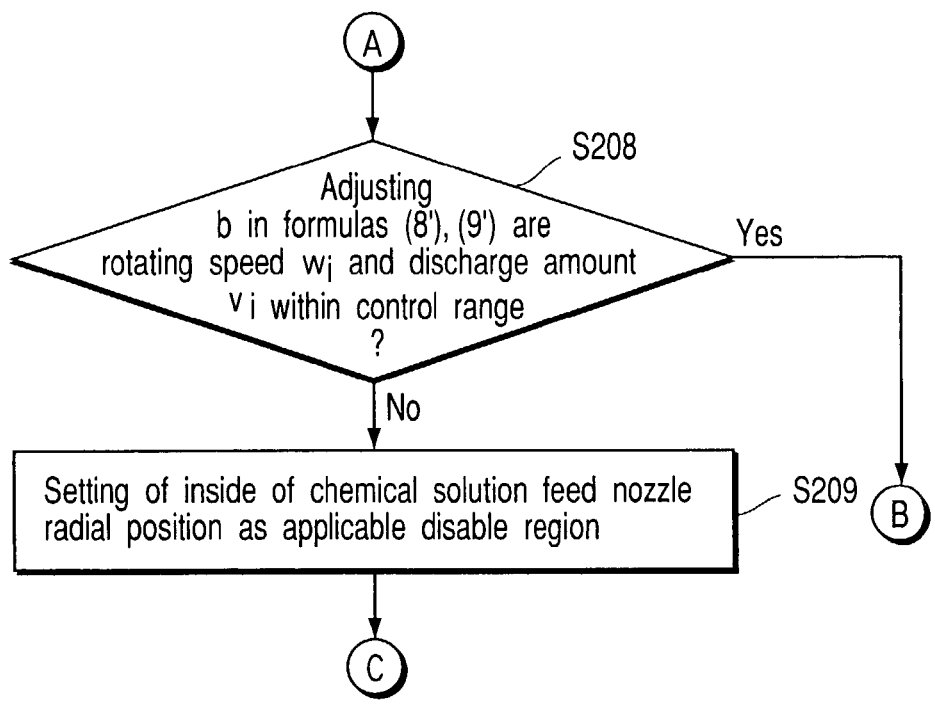
FIG. 6 is a flowchart showing a method of determining the relation of the nozzle radial position $R_n$, chemical solution feed speed $v_n$, and substrate rotational frequency $w_n$ with respect to the time according to the second embodiment.

The method of determining the chemical solution feed nozzle position, chemical solution feed speed (chemical solution discharge pressure), and substrate rotational frequency with respect to the time from the outermost circumference is explained by referring to FIGS. 5 and 6. FIGS. 5 and 6 are flowcharts showing a method of determining the relation of the nozzle radial position $R_n$, chemical solution discharge pressure $v_n$, and substrate rotational frequency $w_n$ with respect to the time according to the second embodiment.

(Step S201)

The outermost circumference $R_{nout}$ of the substrate is set as the operation start position (first position) of the move section of the chemical solution feed nozzle.

(Steps S202 to S206)

Steps S202 to S206 are same as steps S102 to S106 described above, and explanation is omitted. At step S204, however, the nozzle position $R_{nout}$ is set at nozzle position $R_i$.

(Step S207)

It is determined whether or not the calculated substrate rotational frequency $w_i$ and chemical solution discharge pressure $v_i$ are within the control range.

(Step S208)

At step S207, if the substrate rotational frequency $w_i$ and chemical solution discharge pressure $v_i$ are determined to be outside of the control range, adjusting the value of b in the formulas (8') and (9'), the substrate rotational frequency $w_i$ and chemical solution discharge pressure $v_i$ are calculated, and it is determined whether or not the substrate rotational frequency $w_i$ and chemical solution discharge pressure $v_i$ are within the control range.

(Step S209)

As a result of determination at step S208, if the substrate rotational frequency $w_{n''}$ and chemical solution discharge pressure $v_{n''}$ do not settle within the control range, the inside of the set chemical solution feed nozzle radial position is set as inapplicable range, and the process is terminated.

(Step S210)

At step S207, if the substrate rotational frequency $w_i$ and chemical solution discharge pressure $v_i$ are determined to be within the control range, it is determined whether or not the peripheral value i satisfies the condition of i<14.05282. When it is determined that i<14.05282 is satisfied, step S211 is executed.

(Step S211)

Determining the peripheral value $\Delta i$ changing in 0.05 sec (unit time), the peripheral value $i'=i+\Delta i$ before 0.05 sec is determined. The chemical solution feed nozzle radial position $R_{i'}$ corresponding to the determined peripheral value $i'$ is calculated.

(Step S212)

The nozzle position $R_{i'}$ (second position) after 0.05 sec is set again newly as $R_i$ (first position).

(Step S206)

Using the substrate rotational frequency $w_{nout}$ and chemical solution discharge pressure $v_{nout}$ at $R_{nout}=55.4$ and the formulas (8') and (9'), the chemical solution discharge pressure $v_i$ and substrate rotational frequency $w_i$ at the nozzle position $R_i$ (peripheral value i) are determined.

Until it is determined to be i<14.05282, or until inapplicable region is determined, steps S206, S207, S211, and S212 are repeated.

Figure 7A:
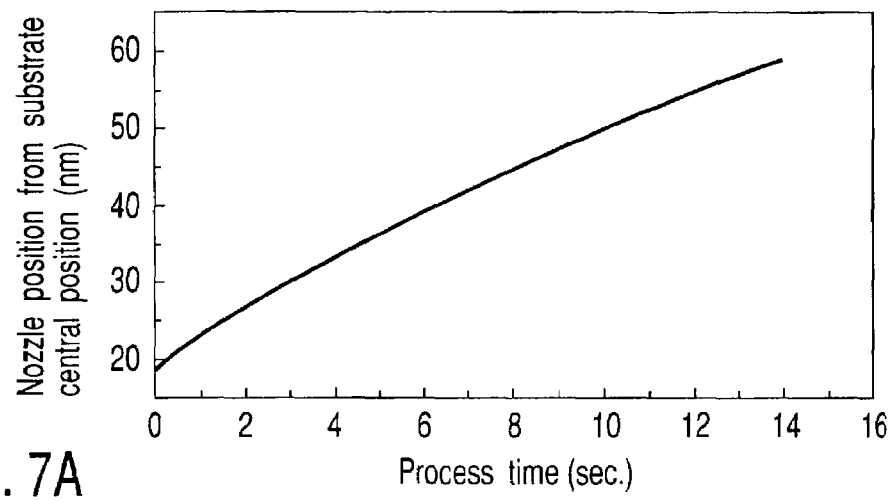
FIG. 7A is a graph showing the nozzle position from the center of the substrate with respect to the process time according to the second embodiment.
Figure 7B:
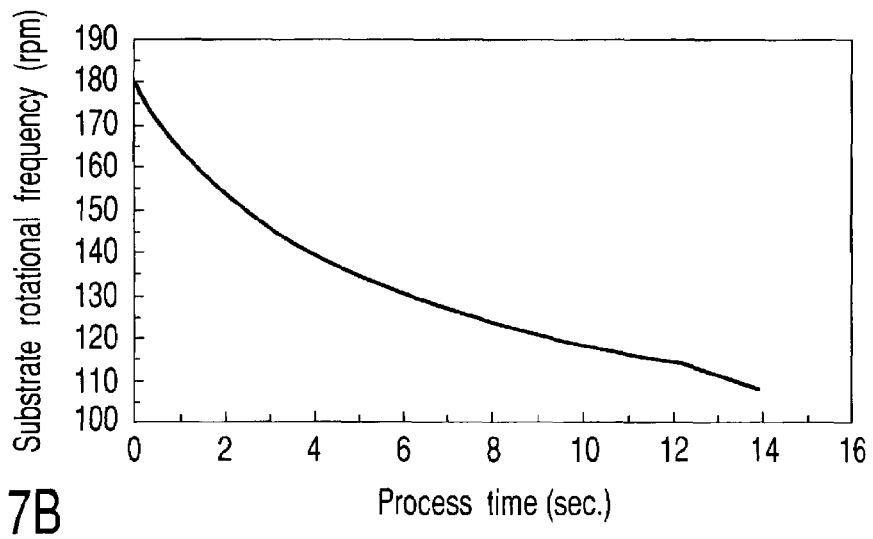
FIG. 7B is a graph showing the substrate rotational frequency with respect to the process time according to the second embodiment.
Figure 7C:
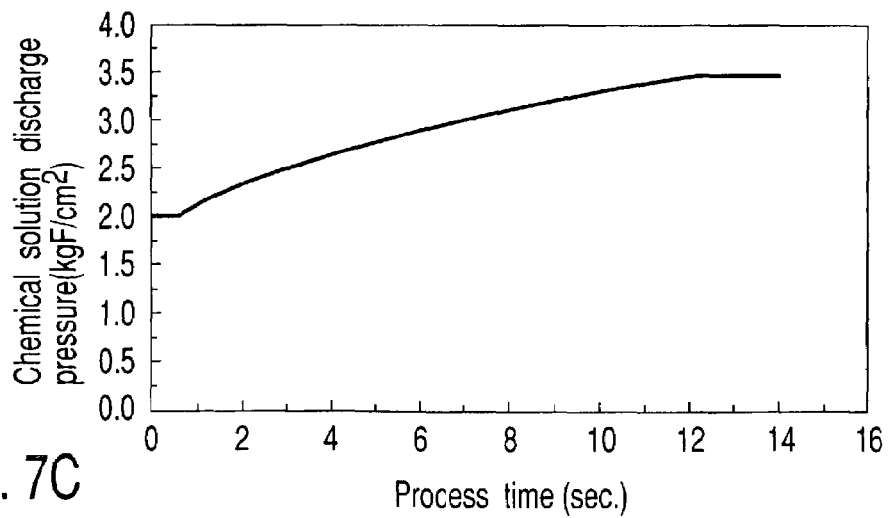
FIG. 7C is a graph showing the chemical solution discharge pressure with respect to the process time according to the second embodiment.
Figure 10:
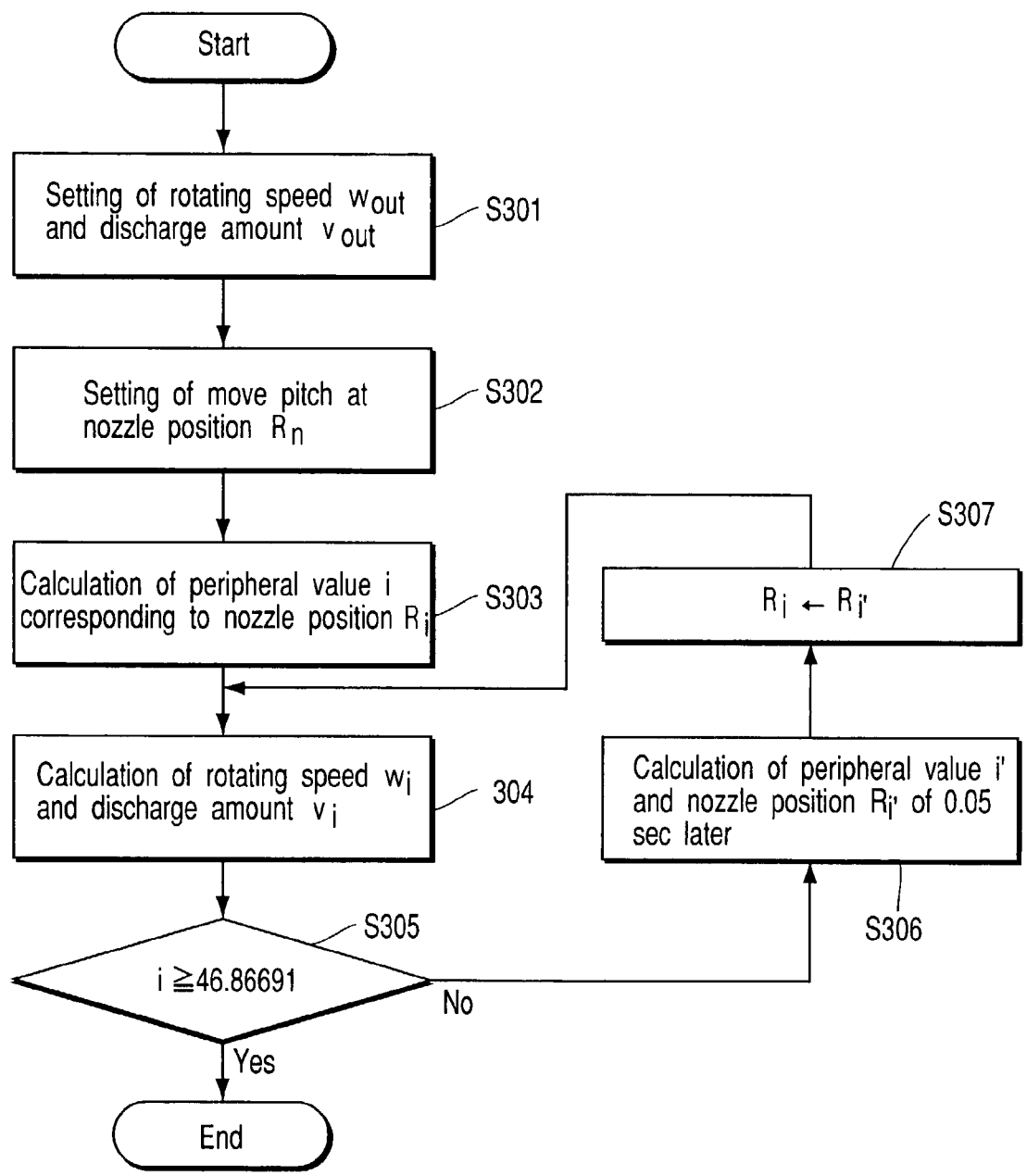
FIG. 10 is a flowchart showing a method of determining the relation of nozzle radial position $R_n$, chemical solution feed speed $v_n$, and substrate rotational frequency $w_n$ with respect to the treatment time according to a fourth embodiment of the present invention.

FIGS. 7A, 7B and 7C show the relation of the position of the chemical solution feed nozzle in the radial direction, chemical solution discharge pressure, and substrate rotational frequency with respect to the time obtained in the procedure explained above. Specifically, FIG. 7A is a graph showing the nozzle position from the center of the substrate with respect to the process time, FIG. 7B is a graph showing the substrate rotational frequency with respect to the process time, and FIG. 7C is a graph showing the chemical solution discharge pressure with respect to the process time.

The method of determining the radial position of the chemical solution feed nozzle, chemical solution discharge pressure, and substrate rotational frequency with respect to the time can be applied not only when the radial direction move of the chemical solution feed nozzle is a geometrical series motion to the peripheral value, but also when the radial direction move of the chemical solution feed nozzle is constant.

In the process time of 0 to 0.8 sec, the chemical solution discharge pressure is constant, which is because the discharge pressure control lower limit is 2 kgF/cm². In this region, the value of b is varied so that the value of the chemical solution discharge pressure v may be constant in the formula (8'). Depending on the value of b, the substrate rotational frequency is set in the formula (9'). Similarly, after the process time of 12 sec, the chemical solution discharge pressure is constant. This is because the upper limit of the discharge pressure is 3.5 kgF/cm², and the value of b is varied so as not to exceed the maximum chemical solution discharge pressure $v_{max}$ corresponding to the maximum discharge pressure in the formula (8'). Thus, the chemical solution feed speed and substrate rotational frequency are basically controlled by the formulas (8') and (9'), and the value of b may be changed property depending on the restriction in the apparatus.

Depending on the control patterns shown in FIGS. 7A, 7B and 7C, the position of the nozzle from the center of the substrate, substrate rotational frequency, and chemical solution feed speed from the nozzle were adjusted by using the apparatus shown in FIG. 1, and a liquid coat film was formed on the circular substrate in a thickness of 10 μm. After forming the coat film, the solvent was removed under reduced pressure, and further by baking, a pigment film was formed on the circular substrate in a film thickness of 0.3 μm in film thickness uniformity of 1% or less. In this embodiment, as closer to the center, the width of the dropping trajectory of the chemical solution from the chemical solution feed nozzle is broader. After application, when these trajectories spread but not contact with each other, it is preferred to transfer to evacuating or drying process after leveling sufficiently. Leveling is executed by placing the coated substrate in a closed space, or in a space filled with vapor of solvent. When using a quick drying solvent, it is preferred to perform application in solvent. atmosphere. The leveling is preferred to be carried out at a rotational frequency not more than the maximum rotational frequency which dose not allow the liquid film in the outermost circumference on the substrate to move outside of the substrate by the centrifugal force. The profile of the rotational frequency is determined by the balance of the liquid surface tension, interface tension, and centrifugal force. At this time, tiny undulations may be left over (in particular on the outer circumference of the substrate). In this case, undulations may be minimized in size by applying vibration to the liquid film by using sonic wave or ultrasonic wave in the process of raising the viscosity of the liquid film.

In a prior stage to drying, the liquid may move to the inside by surface tension, and the liquid film thickness may be thinner in the substrate edge area. In such a case, by opening above the substrate immediately before drying, and rotating the substrate at about 150 to 200 rpm, an air stream is produced from above to the substrate surface in the center of the substrate, and further toward the outer peripheral direction of the substrate, and thereby the liquid film moved to the inside can be pulled to the outside. By drying immediately, an excellent film thickness uniformity of small film thickness fluctuations will be obtained in the edge area.

The embodiment relates to coating of a compact disc, but not limited to this, it may be also applied to DVD, mini disc, other doughnut type substrate, circular semiconductor wafer, etc. The material is not limited to a laser beam absorbing material alone, but it is also usable in application of a liquid containing magnetic material, or a liquid containing metal material.

The coating condition may be controlled freely as far as it is controlled by setting $w_{nout}$ as in the formula (12), the chemical solution feed speed, corresponding chemical solution discharge pressure, and substrate rotational frequency as in the formulas (8') and (9'), and the position of the chemical solution feed nozzle with respect to the center of the substrate according to the formula (3). Meanwhile, the solution discharge pressure and substrate rotational frequency may be controlled by a parameter h, and the chemical solution feed nozzle position may be controlled by dividing into plural regions and adjusting $d_1$, a, and n.

Third Embodiment

This embodiment relates to a technique of forming an interlayer insulating film of a semiconductor substrate by coating.

A substrate with wiring was set in an application apparatus shown in FIG. 1. The application on this substrate was determined as in the formula (15) so that the trajectory of the chemical solution feed nozzle may conform to $d_1$=1.5 mm, and a=0.995.

$$r = 1.5 \times \frac{1 - 0.995^{n-1}}{1 - 0.995} \quad (23)$$

In this coating condition, however, film thickness abnormality was observed inside of the diameter of 7.6 mm, and hence to eliminate film thickness abnormality within the diameter of 7.6 mm, the condition was determined as in the formula (24) so as to satisfy $d_0$=4.22 and a=0.844.

$$r = 4.22 \times \frac{1 - 0.844^{n-1}}{1 - 0.844} \quad (24)$$

That is, inside of diameter 7.6 mm, on the basis of the control formula of the formula (24), the chemical solution feed nozzle position, substrate rotational frequency, and chemical solution discharge pressure with respect to the treatment time were calculated, and outside of diameter 7.6 mm, the chemical solution feed nozzle position, substrate rotational frequency, and chemical solution discharge pressure with respect to the treatment time were calculated on the basis of the control formula of the formula (23).

Inside of diameter 7.6 mm, the peripheral value n is $0.5 \leq n \leq 3.00$, and outside of diameter 7.6 mm, the peripheral value n is $6.11 \leq n \leq 80.4$.

The relation of the chemical solution feed nozzle position, substrate rotational frequency, and chemical solution discharge pressure with respect to the treatment time calculated on the basis thereof is shown in FIGS. 8A, 8B and 8C. Specifically, FIG. 8A is a graph showing the nozzle position from the center of the substrate with respect to the process time, FIG. 8B is a graph showing the substrate rotational frequency with respect to the process time, and FIG. 8C is a graph showing the chemical solution discharge pressure with respect to the process time.

Figure 9:
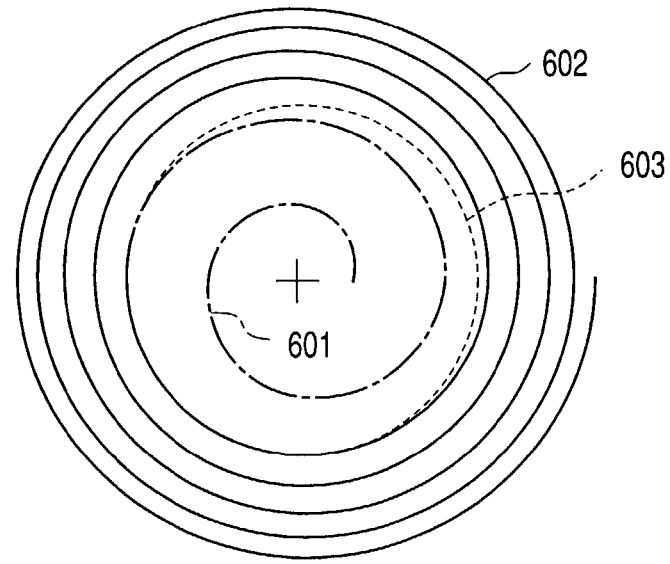
FIG. 9 is a view showing the trajectory of the chemical solution feed nozzle dropped on the basis of the nozzle position from the center of the substrate, substrate rotational frequency and chemical solution discharge pressure with respect to the process time shown in FIGS. 8A, 8B and 8C.

FIG. 9 shows the trajectory of the chemical solution feed nozzle inside and outside of the dropping diameter 7.6 mm. That is, FIG. 9 shows the trajectory of the chemical solution feed nozzle dropping according to the nozzle position from the center of the substrate, substrate rotational frequency, and chemical solution discharge pressure with respect to the process time shown in FIGS. 8A, 8B and 8C. In FIG. 9, reference numeral 601 shows a trajectory inside of diameter 7.6 mm, 602 is a trajectory outside of diameter 7.6 mm, and 603 shows a circle having the diameter extending between the connection point of the trajectory inside of diameter 7.6 and the trajectory outside, and the center of the substrate.

In the relation between the process time and chemical solution discharge pressure shown in FIG. 8C, the discharge pressure is constant between process time 0 and 1.7 sec, which is because the discharge pressure control lower limit is 2 kgF/cm². In this region, the value of b is varied so that the value of chemical solution discharge pressure v in the formula (8') may be constant, and the substrate rotational frequency is set accordingly in the formula (9'). Similarly, after the process time of 8.5 sec, the discharge pressure is constant. This is because the discharge pressure upper limit is 3.5 kgF/cm², and the value of b is varied in the formula (8') so as not to exceed the maximum chemical solution discharge pressure $v_{max}$ corresponding to the maximum discharge pressure. Thus, the chemical solution feed speed and substrate rotational frequency are basically controlled according to the formulas (8') and (9'), and the value of b may be properly varied depending on the restriction in the apparatus.

Depending on the control patterns shown in FIGS. 8A, 8B and 8C, the position of the nozzle from the center of the substrate, substrate rotational frequency, and chemical solution feed speed from the nozzle were adjusted by using the apparatus shown in FIG. 1, and a liquid coat film was formed on the circular substrate in a thickness of 20 μm. After forming the coat film, the solvent was removed under reduced pressure, and further by baking, an interlayer insulating film was formed on the circular substrate in a film thickness of 1 μm in a film thickness uniformity of 1% or less. In this embodiment, as closer to the center, the width of the dropping trajectory of the chemical solution from the chemical solution feed nozzle is broader. However, after application, when these trajectories spread but not contact with each other, it is preferred to hold the coated substrate in a closed space, or in a space filled with vapor of solvent to wait until the liquid film is spread and leveled sufficiently, and then transfer to drying process such as evacuation. When using a quick drying solvent, it is preferred to perform application in solvent atmosphere. The profile of the leveling is determined by the balance of the liquid surface tension, interface tension, and centrifugal force. At this time, tiny undulations may be left over. In this case, undulations may be minimized in size by applying vibration to the liquid film by using sonic wave or ultrasonic wave in the process of raising the viscosity of the liquid film.

In a prior stage to drying, the liquid may move to the inside by surface tension, and the liquid film thickness may be thinner in the substrate edge area. In such a case, by opening above the substrate immediately before drying, and rotating the substrate at a rotational frequency below the maximum rotational frequency which dose not allow the liquid film in the outermost circumference on the substrate to move outside of the substrate by the centrifugal force, for example, about 70 to 200 rpm, so that an air stream is produced from above to the substrate surface in the center of the substrate, and further toward the outer peripheral direction of the substrate, and thereby the liquid film moved to the inside can be pulled to the outside. By drying immediately, an excellent film thickness uniformity of small film thickness fluctuations will be obtained in the edge area.

In the embodiment, the central part was coated while moving the chemical solution feed nozzle by a particular geometrical series function, but as far as the chemical solution has a property of spreading sufficiently, a specified amount may be dropped on the center of the substrate. In this case, after dropping on the center, the substrate is rotated to spread the liquid film to a position of diameter of about 7.6 mm, and while moving the chemical solution feed nozzle according to the formula (23), the chemical solution feed speed (pressure) and substrate rotational frequency corresponding to the nozzle position may be applied.

The embodiment relates to the interlayer insulating film application of a circular semiconductor substrate, but not limited to this. It may be applied in formation of any coat film such as anti-reflection film, photosensitive material film, low dielectric film, ferrodielectric film, pattern transfer film, flattened film, and circular semiconductor wafer.

The coating condition may be controlled freely as far as it is controlled by setting $w_{nout}$ as in the formula (12), the chemical solution feed speed, corresponding chemical solution discharge pressure, and substrate rotational frequency as in the formulas (8') and (9'), and the position of the chemical solution feed nozzle with respect to the center of the substrate according to the formula (3). Meanwhile, the solution discharge pressure and substrate rotational frequency may be controlled by a parameter h, and the chemical solution feed nozzle position may be controlled by dividing into plural regions and adjusting $d_1$, a, and n.

In the embodiment, the spirally dropped liquid line spreads on the substrate due to flowability of the liquid, and a liquid form is formed on the entire surface except for the edge area of the substrate, but a linear liquid drop may remain in the central area. In such a case, by decreasing the radial direction move pitch and change rate of the chemical solution feed nozzle in the central part, and the excessively dropped chemical solution may be physically shielded by emitting gas from the side of the chemical solution dropped continuously, sucking the chemical solution itself, or inserting a shutter, so that the chemical solution feed volume per unit area can be adjusted.

Fourth Embodiment

On the basis of the parameter determining method mentioned above, a method of applying a laser reaction film to a compact disc (CD) is explained. Considering process by blue semiconductor laser as a laser reaction film, a pigment having an absorption in 400 to 700 nm was dissolved in an organic solvent. The solid matter concentration in the solution was 2%. The coating range of the compact disc is an outside region of 19 mm in diameter from the center (outside diameter 55.4 mm). This substrate was coated in the condition of $d_1=1.65$, $a=0.995$. Supposing the trajectory $S_n$ of the chemical solution feed nozzle to be:

$$r = 1.5 \times \frac{1 - 0.995^{n-1}}{1 - 0.995} \quad (25)$$

(Step S301)

First, the rotational frequency $w_{nout}=61.26$ rpm and discharge pressure $v_{nout}$ (=2 kgF/cm$^2$: discharge increasing or decreasing speed of chemical solution feed nozzle) at the outermost circumference discharge position $R_{nout}=55.4$ mm are determined. The rotational frequency and discharge pressure determined herein are adjusted so that the chemical solution may not be discharged outside of the substrate at the time of application. The control parameters were determined by the method (II) of determining the rotational frequency of the substrate (discharge volume constant) depending on the radial position (r/r$_{out}$) of the chemical solution feed nozzle.

(Step S302)

The trajectory of the chemical solution feed nozzle in the radial direction, that is, the nozzle move pitch at the nozzle position $R_n$ is set. In this embodiment, the initial term $d_1$ of the geometrical series is 1.5, and the change rate "a" is 0.995.

(Step S303)

Using the set initial term $d_1$, change rate a, and formula (25), the peripheral value $n_{in}$ corresponding to the innermost circumference $R_{nin}$ of compact disc ($R_{nin}=19$ mm) is determined. In this embodiment, the peripheral value n corresponding to the innermost circumference $R_{nin}=19$ mm of the compact disc is 14.47596.

On the other hand, the peripheral value $n_{out}$ corresponding to the outermost circumference $R_{nout}$ of the substrate is $n_{out}=46.86691$. The spiral trajectory of the chemical solution feed nozzle starting from the position of 19 mm from the center of the substrate reaches the substrate edge by rotating on the substrate by 32.39094 (=$n_{out}$-$n_{in}$) revolutions.

(Step S304)

Using the substrate rotational frequency $w_{nout}$ and chemical solution discharge pressure $v_{nout}$ (=2 kgF/cm$^2$: discharge increasing or decreasing speed of chemical solution feed nozzle) at $R_{nin}=19$ mm, and the formulas (16) and (17), the substrate rotational frequency $w_i$ ($w_{14.47596}$) at peripheral value i (=14.47596) is determined.

$$v_n = v_{out} \times b \times \sqrt{\frac{R_{n+0.5} - R_{n-0.5}}{R_{nout+0.5} - R_{nout-0.5}}} \quad (16)$$

$$w_n = w_{nout} \times b \times \frac{r_{out}/r}{\sqrt{\frac{R_{n+0.5} - R_{n-0.5}}{R_{nout+0.5} - R_{nout-0.5}}}} \quad (17)$$

At this time, in order that the chemical solution discharge pressure may not change, the coefficient b is adjusted. That is, in the formula (16), putting $v_n=2$ kgF/cm$^2$, the coefficient b which dose not allow the chemical solution discharge pressure is determined. The obtained value of the coefficient b is put in the formula (17), and the substrate rotational frequency $w_n$ is determined.

(Step S305)

It is determined whether or not the peripheral value i satisfies the condition of i≧46.86691. When it is determined that i≧46.86691 is not satisfied, step S108 is executed.

(Step S306)

Determining the peripheral value Δi changing for 0.05 sec (unit time), the peripheral value i'=i+Δi after 0.05 sec is determined. The chemical solution feed nozzle radial position $R_{i'}$ corresponding to the determined peripheral value i' is calculated. From arbitrary time t sec to t+0.05 sec, all values of $R_n$, $v_n$, and $w_n$ are assumed to be constant.

When the substrate is rotated at frequency $w_n$ at time t sec, from time t sec to time t+0.05 sec, the substrate rotates by:

$$\theta n = \frac{wn}{60} \times 0.05 \text{ (revolution)} \quad (26)$$

For example, assuming $w_{14.47596}=180$ rpm, it rotates by 0.15 revolution. Therefore, after rotating for 0.05 sec at $w_n$, the value of n is:

$$n'=14.47596+0.15=14.62596 \quad (27)$$

The value of $R_{14.62596}$ corresponding to n'=14.62596 is $R_{14.62596}$=19.19733 from the formula (3).

(Step S307)

The chemical solution feed nozzle position $R_{i'}$ (second position) after 0.05 sec is set again newly as $R_i$ (first position).

(Step S304)

Using the substrate rotational frequency $w_{nout}$ and chemical solution discharge pressure $v_{nout}$ at $R_{nout}$=55.4 and the formulas (8') and (9'), the chemical solution discharge pressure $v_i$ and substrate rotational frequency $w_i$ at the nozzle position $R_i$ (peripheral value i) newly set at step S307 are determined.

(Step S305)

Until it is determined to be i≧46.86691, steps S306, S307, and S304 are repeated.

In the procedure explained above, the discharge position $R_n$, discharge volume $v_n$, and rotational frequency $w_n$ with respect to the time are expressed.

Figure 11A:
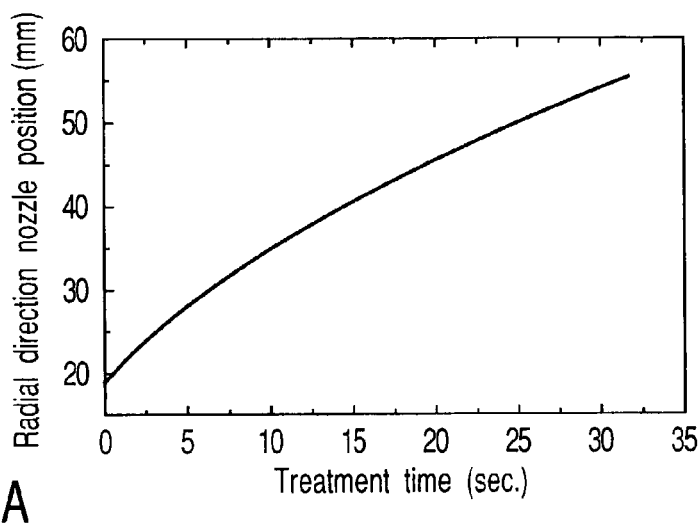
FIG. 11A is a graph showing the nozzle position from the center of the substrate with respect to the treatment time according to the fourth embodiment.
Figure 11B:
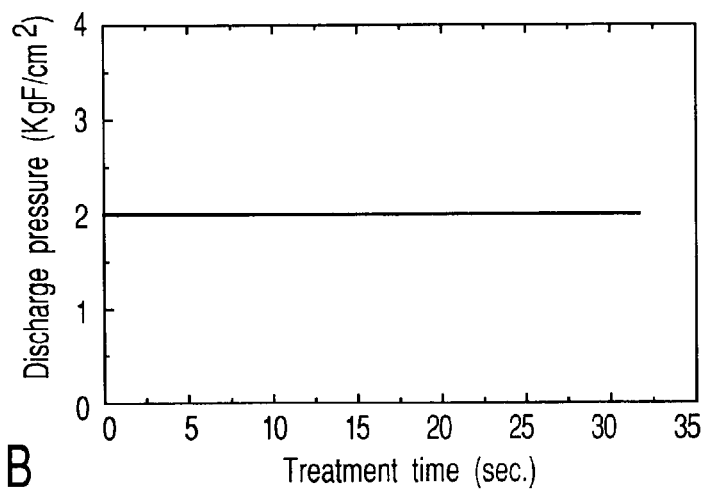
FIG. 11B is a graph showing the chemical solution discharge pressure with respect to the treatment time according to the fourth embodiment.
Figure 11C:
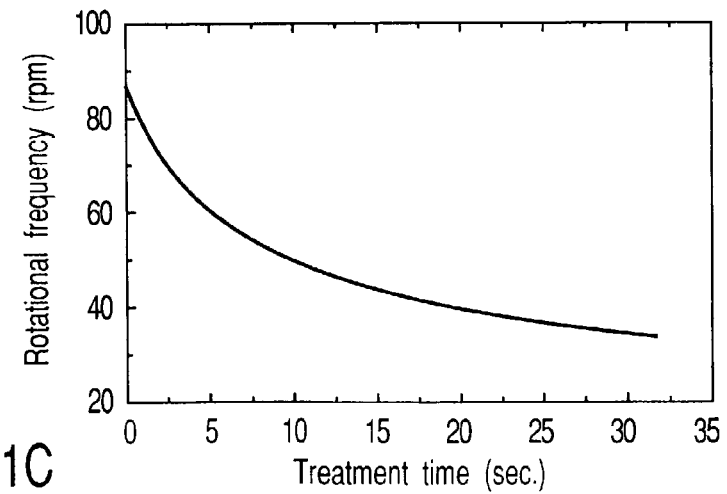
FIG. 11C is a graph showing the substrate rotational frequency with respect to the treatment time according to the fourth embodiment.

The relation of the radial position of the chemical solution feed nozzle, the chemical solution feed pressure, and the substrate rotational frequency with respect to the processing time obtained in these procedures is shown in FIGS. 11A, 11B and 11C. Specifically, FIG. 11A is a graph showing the nozzle position from the center of the substrate with respect to the process time, FIG. 11B is a graph showing the chemical solution discharge pressure with respect to the process time, and FIG. 11C is a graph showing the substrate rotational frequency with respect to the process time.

Depending on the control patterns shown in FIGS. 11A, 11B and 1C, the position of the chemical solution feed nozzle from the center of the substrate and substrate rotational frequency were adjusted while keeping constant the chemical solution feed speed from the chemical solution feed nozzle by using the apparatus shown in FIG. 1, and a liquid coat film was formed on the circular substrate in a thickness of 20 μm. After forming the coat film, the solvent was removed under reduced pressure, and further by baking, a pigment film was formed on the circular substrate in a film thickness of 0.4 μm in film thickness uniformity of 1% or less.

When the liquid dropping on the substrate spreads slowly and hardly contacts with an adjacent liquid line, it is preferred to contact with the adjacent line by spreading the liquid by putting the substrate in an enclosed container or in solvent atmosphere. Or, when using a quick drying solvent, it is preferred to perform application in solvent atmosphere. The profile of the leveling is determined by the balance of the liquid surface tension, interface tension, and centrifugal force. At this time, tiny undulations may be left over. In this case, undulations may be minimized in size by applying vibration to the liquid film by using sonic wave or ultrasonic wave including wavelength in a range of about S/2 to S with respect to the period S of film thickness spots in the process of raising the viscosity of the liquid film.

In a prior stage to drying, the liquid may move to the inside by surface tension, and the liquid film thickness may be thinner in the substrate edge area. In such a case, by opening above the substrate immediately before drying, and rotating the substrate at about 150 to 200 rpm, an air stream is produced from above to the substrate surface in the center of the substrate, and further toward the outer peripheral direction of the substrate, and thereby the liquid film moved to the inside can be pulled to the outside. By drying immediately, an excellent film thickness uniformity of small film thickness fluctuations will be obtained in the edge area.

The embodiment relates to coating of a compact disc, but not limited to this, it may be also applied to DVD, mini disc, other doughnut type substrate, circular semiconductor wafer, etc. The material is not limited to a laser beam absorbing material alone, but it is also usable in application of a liquid containing magnetic material, or a liquid containing metal material.

The coating condition may be controlled freely as far as it is controlled by setting $w_{nout}$ as in the formula (12), the chemical solution feed speed, corresponding chemical solution discharge pressure, and substrate rotational frequency as in the formulas (16) and (17), and the position of the chemical solution feed nozzle with respect to the center of the substrate according to the formula (3). Meanwhile, the solution discharge pressure and substrate rotational frequency may be controlled by a parameter h, and the chemical solution feed nozzle position may be controlled by dividing into plural regions and adjusting $d_1$, a, and n.

Fifth Embodiment

Figure 12A:
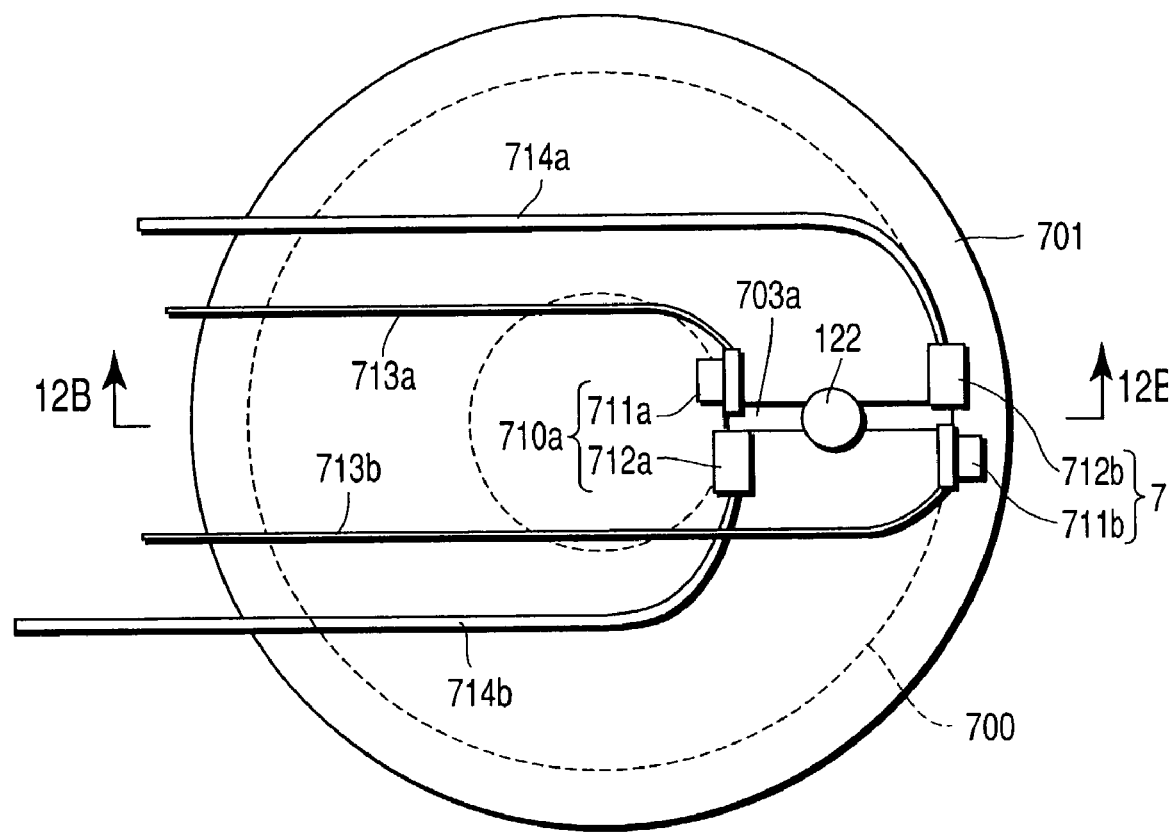
FIGS. 12A and 12B are diagrams schematically showing a configuration of an application apparatus according to a fifth embodiment of the present invention.
Figure 12B:
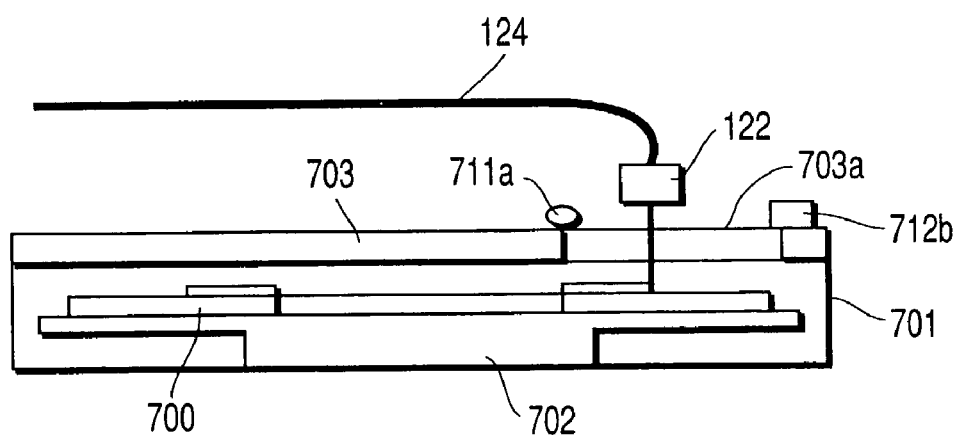

The coat film forming method explained in the fourth embodiment was executed by using an application apparatus shown in FIGS. 12A and 12B. FIGS. 12A and 12B are diagrams schematically showing a configuration of the application apparatus in the fifth embodiment of the invention. FIG. 12A is a plan view showing a configuration of the application apparatus, and FIG. 12B is a sectional view taken along the line 12A-12A' of FIG. 12A.

The application apparatus shown in FIGS. 12A and 12B comprises a substrate-mounting platform 702 having a rotating function in a lower unit 701. A top plate 703 is provided on the lower unit 701. A slit 703a is formed in the top plate 703 from the chemical solution feed start position to the application end portion of a substrate 700, so that the chemical solution may be applied on the substrate 700. The top plate 703 is opened when delivering or discharging the substrate 700. The top plate 703 may be opened either by a mechanism of moving the top plate 703 upward, or a mechanism of lowering the lower unit 701 including the substrate-mounting platform 702 for mounting the substrate 700.

A chemical solution feed nozzle 122 moving above the slit 703a of the top plate 703 is provided. In the chemical solution feed nozzle 122, a chemical solution feed pump (not shown) is connected for feeding the chemical solution to the chemical solution feed nozzle 122 through a chemical solution feed pipe 124. The chemical solution discharge speed from the chemical solution feed nozzle 122 is controlled by regulating the chemical solution feed pressure from the chemical solution feed pump.

On the top plate 703 at the chemical solution feed start position and chemical solution feed end position, chemical feed shielding mechanism 710a, 710b are provided independently from the chemical solution feed nozzle 122.

While the chemical solution is supplied on the substrate 700, the rotational frequency of the substrate-mounting platform 702, the moving speed of the drive system (not shown) for driving the nozzle, and the chemical solution discharge speed from the chemical solution feed nozzle 122 are controlled respectively by a rotary drive control unit (not shown), a nozzle drive control unit (not shown), and a chemical solution feed pump (not shown). A controller (not shown) for supervising the three control units is disposed at the upstream side.

The configuration of the chemical solution shielding mechanism 710 (710a, 710b) is explained by referring to FIGS. 13A and 13B. FIGS. 13A and 13B are schematic diagrams showing the configuration of the chemical solution shielding mechanism according to the fifth embodiment of the invention. FIG. 13A shows an operating state of shielding the chemical solution, and FIG. 13B shows an operating state in which the chemical solution is not shielded. As shown in FIGS. 13A and 13B, the chemical solution shielding mechanism comprises a flexible tube 721 and a gas injection nozzle 722 sequentially connected to a gas feed pipe 713 (not shown). The chemical solution shielding mechanism further comprises: a nozzle opening and closing control piezo unit 723 for controlling the gas flow by deforming or opening the flexible tube 721; and a chemical solution mist recovery unit 724 disposed to enclose the chemical solution 720 dropped from the chemical solution feed nozzle 122 with the gas injection nozzle 722. The nozzle opening and closing control piezo unit 723 has a piezo electric for expanding and contracting by control of applied voltage. By controlling the voltage applied to the piezo element, the flexible tube 721 is deformed or opened. The flexible tube 721 may be deformed and opened directly by the piezo element, or by a member connected to the piezo element.

The film forming method by using this application apparatus is explained.

The operation is executed sequentially in the sequence of opening of the top plate 703, carrying of the substrate 700 into the lower unit 701, mounting of the substrate 700 on the substrate-mounting platform 702, and closing of the top plate 703. In succession, in the space above the top plate 703 at the chemical solution feed start position, the chemical solution feed nozzle 122 is moved in a chemical solution feed stopped state. After discharging gas from the gas injection nozzle 722 of the chemical solution shielding mechanism 710a, discharge of chemical solution from the chemical solution feed nozzle 122 is started. The discharged chemical solution 720 is transferred to the chemical solution mist recovery unit 724 by the gas stream preliminarily formed underneath. At this time, the chemical solution mist recovery unit 724 sucks sufficiently to recover the mist produced when the chemical solution 720 collides against the gas. The sucked chemical solution is conveyed outside of the application apparatus through a waste liquid pipe 714.

When discharge of chemical solution from the chemical solution feed nozzle 122 is stabilized, the nozzle opening and closing control piezo unit 723 is pushed out to deform the flexible tube 721, thereby shutting the gas supply. As a result, supply of chemical solution 720 from the chemical solution feed nozzle 122 to the substrate 700 is started (origin of processing time). The radial position of the chemical solution feed nozzle, chemical solution discharge pressure, and substrate rotational frequency are controlled according to the control set values of the nozzle move, discharge pressure of chemical solution feed nozzle, and substrate rotational frequency with respect to the time shown in FIGS. 11A, 11B and 11C.

When the chemical solution feed nozzle 122 moves to the chemical solution feed end position on the outer periphery of the substrate, the chemical solution shielding mechanism 710b disposed on the outer circumference is put in action. The chemical solution shielding mechanism 710b on the outer circumference is preliminarily disposed above the chemical solution feed end position. The nozzle opening and closing control piezo unit 723 is returned immediately before the chemical solution 720 supplied from the chemical solution feed nozzle 122 comes to the gas injection nozzle 722, and the deformation of the flexible tube 721 is released, and gas is injected. The injected gas collides against the chemical solution 720, and the dropping trajectory of the chemical solution is changed. After the dropping trajectory is changed, the chemical solution is guided into the chemical solution mist recovery unit 724, and is recovered. At this chemical solution feed end position, when the chemical solution feed nozzle 122 is stopped, and discharge of the chemical solution 720 is also stopped.

When the chemical solution discharge from the chemical solution feed nozzle 122 is completely stopped, the nozzle opening and closing control piezo unit 723 of the chemical solution shielding mechanism 710b is pushed out, and the flexible tube 721 is deformed to stop supply of gas.

Further, the chemical solution feed nozzle 122 is moved away from above the top plate 703, and the top plate 703 is released, and then the substrate 700 is discharged from the lower unit 701. Rotation of the substrate 700 is preferred to be continued until the top plate 703 is released. If the substrate 700 is stopped while the top plate 703 is still present, the film thickness may be changed due to different in the environment above the substrate 700, for example, in the area of the slit 703a.

Drying of the substrate conforms to the fourth embodiment, and specific explanation is omitted.

Sixth Embodiment

This embodiment relates to a technique of forming an interlayer insulating film on a semiconductor substrate by a coating method.

A semiconductor substrate with wiring on the surface is set in the application apparatus shown in FIG. 1. The application on the semiconductor substrate is determined as shown in the formula (28) so that the trajectory of the chemical solution feed nozzle 122 may be $d_1=1.65$ mm and $a=0.995$.

$$r = 1.65 \times \frac{1 - 0.995^{n-1}}{1 - 0.995} \quad (28)$$

In this application condition, however, since film thickness abnormality occurs inside of diameter 9.8 mm, a chemical solution partial shielding mechanism is provided inside of diameter 9.8 mm, and the chemical solution is shielded partially, and supply amount of chemical solution is adjusted. In the region of partial shielding of the chemical solution, the condition at the radial position of 9.8 mm in the sequence of applying the outside of the region is directly employed. That is, at the substrate rotational frequency of 180 rpm, and chemical solution discharge pressure of 2 kgF/cm², the move pitch/revolution of the chemical solution feed nozzle in the radial direction is set at the minimum pitch of 1.609 mm when applying the region of outside of diameter 9.8 mm. By keeping these parameters constant, the chemical solution shielding rate C at the radial position r by the chemical solution partial shielding mechanism increases monotonously from 0 to 1 from the radial position 9.8 mm to 0 mm, and it can be expressed in a linear equation as shown in the following formula (29):

$$C = -\frac{1}{r_C} \times r + 1 \quad (29)$$

where r is the radial position, and $r_c$ is the outermost diameter requiring chemical solution partial shielding.

Partial shielding of the chemical solution is executed by injecting gas from plural gas injection nozzles to the chemical solution dropped from the chemical solution feed nozzle 122. The shielding rate is adjusted by optimizing the configuration of gas injection nozzles, piping diameter, and gas pressure.

Figure 14:
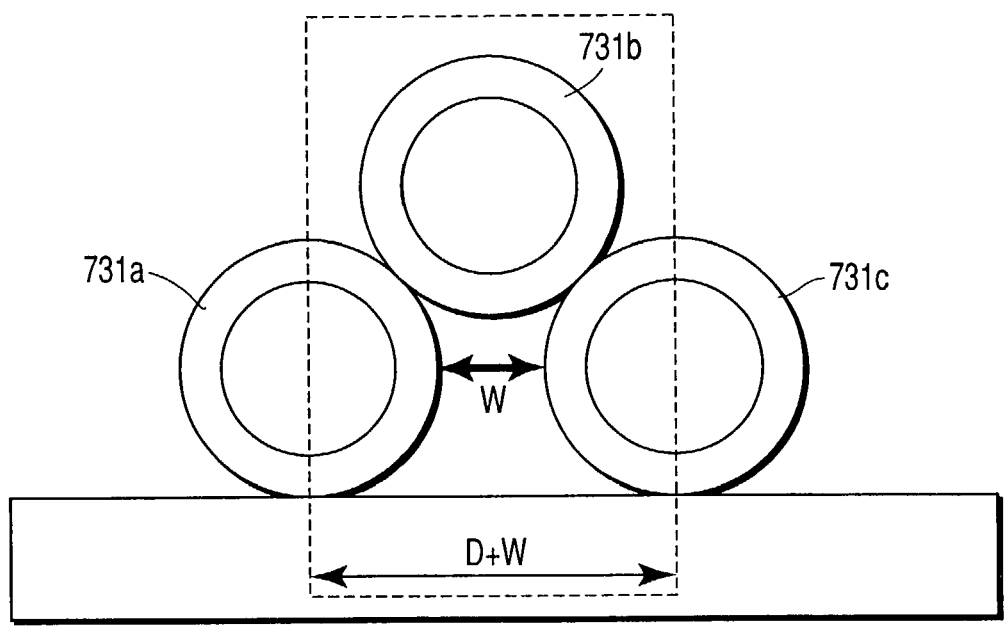
FIG. 14 is a diagram showing an arrangement example of gas injection nozzles in a chemical solution partial shielding mechanism according to a sixth embodiment of the present invention.

An example of arrangement of gas injection nozzles used in partial shielding is shown in FIG. 14. FIG. 14 is a diagram showing an example of arrangement of gas injection nozzles of the chemical solution partial shielding mechanism according to the sixth embodiment of the invention. As shown in FIG. 14, gas injection nozzles 731a, 731b adjacent to one gas injection nozzle 731b are one shielding unit (two gas injection nozzles enclosed by dotted line in diagram), and the width of the shielding units is optimized. When the gap of adjacent gas injection nozzles 731 is narrow, a two-stage structure is formed as shown in FIG. 14, and one-stage structure is formed when narrow.

The outside diameter of one gas injection nozzle 731 is D, the inside diameter is a, and the chemical solution shielding effective width at shielding position is s. Herein, the chemical solution shielding effective width s is the range (diameter) of the gas discharged from one gas injection nozzle 731 having the chemical solution shielding capability.

Using these parameters, the chemical solution-shielding rate C in one shielding unit is expressed as follows.

$$C = \frac{2s}{D+W} \quad (30)$$

On the other hand, the central interval between the first gas injection nozzle 731a and the third gas injection nozzle 731c in one shielding unit is D+W. In order to obtain a specified shielding rate C at the intermediate position of this shielding unit, that is, at the position of (D+W)/2, the positions of the gas injection nozzles 731b, 731c are determined from the formulas (29) and (30).

For example, at the origin position (p=0), the first gas injection nozzle 731a is set, and suppose to replace as follow.

$$r_i = p + \frac{D+W}{2} \quad (30')$$

$$C = \frac{s}{r_i - p}$$

Herein, since one shielding unit is composed of two nozzles, actually the formula (30') may be expressed as:

$$C = \frac{s}{2(r_i - p)} + \frac{s}{2(r_i - p)}$$

That is, referring to one nozzle, the intermediate position $r_i$ is determined so that the shielding rate C may be equal to the value of the chemical solution effective shielding width s being divided by a double value of subtracting the reference position p from the intermediate position $r_i$ of the shielding unit width P, and the shielding unit width P is determined on the basis of the determined intermediate position $r_i$. Specifically, it is calculated as follows.

Assuming the right sides of the formulas (29) and (30') are equal to each other, $r_i$ is calculated, and the following formula (31) is obtained.

$$\frac{s}{r_i} = -\frac{r_i}{r_c} + 1 \quad (31)$$

$$sr_C = -r_i^2 + r_i r_c$$

$$r_i^2 - r_i r_c + sr_c = 0$$

$$r_i = \frac{r_c \pm \sqrt{r_c^2 - 4sr_c}}{2}$$

$$= \frac{r_c(1 \pm \sqrt{1 - 4s/r_c})}{2}$$

$$r_i = \frac{-1 + \sqrt{1 + (-4s/r_c)}}{-2/r_c}$$

$$r_i = p + \frac{D+W}{2}$$

In this embodiment, specifically, setting the outside diameter D of the gas injection nozzle 731 at 0.5 mm, and the chemical solution shielding effective width s at 0.3 mm (gas injection nozzle inside diameter a=0.25 mm), and using the outermost diameter $r_c$=9.8 mm requiring chemical solution shielding, the central position of the second gas injection nozzle 731b is set at 0.310 mm (=$r_i$), and the central position of the third gas injection nozzle 731c is set at 0.620 mm (=2 ($r_i$-p), p=0).

The central positions of the fourth and fifth gas injection nozzles are determined by the following formula (32), which is a generalized formula of (30), supposing the central position of the third gas injection nozzle to be reference position p (=0.620 mm).

$$r_i = \frac{-\left(-\frac{p}{r_c}+1\right) + \sqrt{\left(-\frac{p}{r_c}+1\right)^2 + \left(-\frac{4s}{r_c}\right)}}{-\frac{2}{r_c}} \quad (32)$$

$$r_i = p + \frac{D+W}{2}$$

Accordingly, the central position of the fourth gas injection nozzle is determined as p+$r_i$ (p=0.620 mm), and the central position of the fifth gas injection nozzle 731c is determined as 2r-p (=p+2[rp]).

Further, the central positions of the sixth, seventh, and the eighth, ninth gas injection nozzles are determined from the formula (31), assuming the central position of the fifth, seventh, and other gas injection nozzles to be reference position p. In general terms, the central positions of the 2n-th, 2n+1-th, (n=2, 3, . . . ) gas injection nozzles are determined from the formula (32), supposing the central position of the 2n−1-th gas injection nozzle to be reference position p.

If the following formula (32) results in:

$$\left(-\frac{p}{r_c}+1\right)^2+\left(-\frac{4s}{r_c}\right)\geq 0 \quad (33)$$

it means that the nozzles cannot be arranged in the configuration as shown in FIG. 14 (overlaying or laying flat). In such a case, the one section partitioned in the center of mutually adjacent gas injection nozzles is supposed to be one shielding unit, and the position of the gas injection nozzle may be determined in the following formula (34).

$$r_i = \frac{-\left(-\frac{p}{r_c}+1\right)+\sqrt{\left(-\frac{p}{r_c}+1\right)^2+\left(-\frac{2s}{r_c}\right)}}{-\frac{1}{r_c}} \quad (34)$$

If the formula (34) result in:

$$\left(-\frac{p}{r_c}+1\right)^2+\left(-\frac{2s}{r_c}\right)<0 \quad (35)$$

it means that the layout of the final gas injection nozzles is difficult. In this case, it may be finely adjusted by using a gas injection nozzle having a different outside diameter, or varying the shielding effective width. If the shielding effective width differs, in the formulas (29) to (33), using the chemical solution shielding effective widths $s_1$, $s_2$, $s_3$ of the left, middle and right gas injection nozzles, 2s may be replaced by $s_1/2+s_2+s_3/2$. In the formulas (34) and (35), using the chemical solution shielding effective widths $s_1$, $s_3$ of the left and right gas injection nozzles, s may be replaced by $s_1/2+s_3/2$.

Table 1 shows the results of determining the gas injection nozzle central position in the radial direction and the chemical solution shielding effective width in the case of using gas injection nozzles of outside diameter of 0.5 mm. The first to sixteenth gas injection nozzles are determined in the formula (32), and the seventeenth gas injection nozzle is determined in the formula (34) while varying the chemical solution shielding effective width s.

TABLE 1

| Nozzle No. | Shielding unit start point (mm) | Shielding unit end point (mm) | Central position of gas injection nozzle (mm) | Shielding effective unit (mm) | Position |
|---|---|---|---|---|---|
| 1 | 0.000 | 0.629 | 0.000 | 0.300 | First stage |
| 2 | | | 0.310 | 0.300 | Second stage |
| 3 | 0.62 | 1.284 | 0.620 | 0.300 | First stage |
| 4 | | | 0.952 | 0.300 | Second stage |
| 5 | 1.284 | 2.005 | 1.284 | 0.300 | First stage |
| 6 | | | 1.645 | 0.300 | Second stage |
| 7 | 2.005 | 2.800 | 2.005 | 0.300 | First stage |
| 8 | | | 2.402 | 0.300 | Second stage |
| 9 | 2.800 | 3.697 | 2.800 | 0.300 | First stage |
| 10 | | | 3.249 | 0.300 | Second stage |
| 11 | 3.697 | 4.752 | 3.697 | 0.300 | First stage |
| 12 | | | 4.224 | 0.300 | First stage |
| 13 | 4.752 | 6.094 | 4.752 | 0.300 | First stage |
| 14 | | | 5.423 | 0.300 | First stage |
| 15 | 6.094 | 7.243 | 6.094 | 0.300 | First stage |
| 16 | | | 7.243 | 0.300 | First stage |
| 17 | 7.243 | 9.803 | 9.803 | 0.368 | First stage |

The inside diameter is 0.250 mm in the first to sixteenth gas injection nozzles, and the inside diameter is 0.300 mm in the seventeenth nozzle which differs in the shielding effective width. In each gas injection nozzle, the gas pressure is adjusted so as to achieve a desired shielding effective width.

Figure 15:
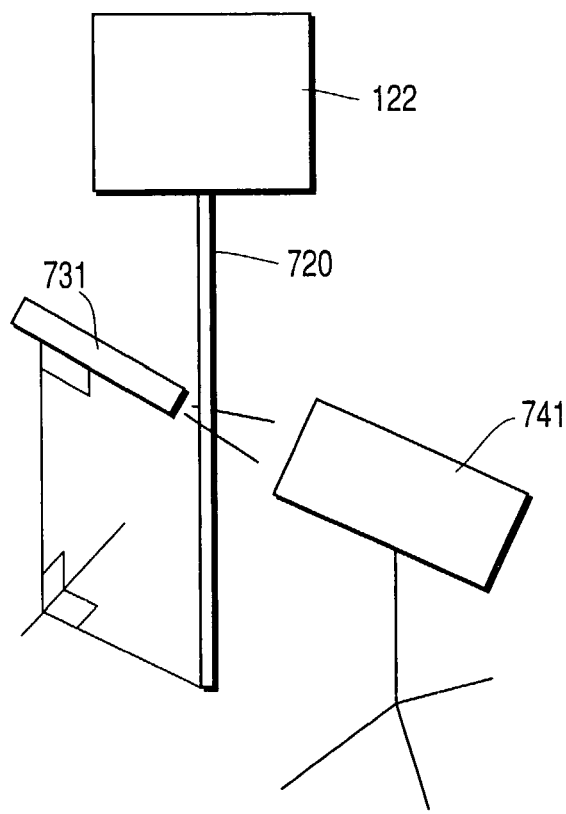
FIG. 15 is a diagram for explaining a method of determining the shielding width by gas injection from the gas injection nozzles.

The adjusting value of gas pressure may be determined by preparing a video camera for observation 741, for example, as shown in FIG. 15, and acquiring the correlation of the gas pressure and effective shielding width. That is, at the same discharge speed as in actual application, the chemical solution 720 is discharged from the chemical solution feed nozzle 122. At a same distant position as in shielding of the chemical solution in actual apparatus, the gas injection nozzle 731 is placed, and while injecting the gas at a specific gas pressure, the chemical solution feed nozzle 122 is moved slowly in one direction. By the video camera for observation 741 placed between the gas injection nozzle 731 and chemical solution 720, the state of the chemical solution 720 is observed, and the shielding width is measured. The discharge width value is acquired by varying the gas pressure, and an optimum gas pressure is determined.

A layout of gas injection nozzles of the chemical solution partial shielding mechanism determined on the basis of the results of the central position and shielding effective width of the gas injection nozzles shown in Table 1 is given in FIG. 16. As shown in FIG. 16, gas injection nozzles $731_1$ to $7311_7$ are arranged.

Further, a configuration of the application apparatus comprising this chemical solution-shielding device is shown in FIGS. 17A and 17B. FIG. 17A is a plan view, and FIG. 17B is a sectional view taken along the line 17A-17A' of FIG. 17A. In FIG. 17, same parts as in FIGS. 12A and 12B are identified with same reference numerals, and the explanation is omitted.

As shown in FIGS. 17A and 17B, when a substrate 700 is put on a substrate-mounting platform 702, in the portion positioned above the center of the substrate 700 on the top plate 703, a chemical solution partial shielding mechanism 750 is disposed. This chemical solution partial shielding mechanism 750 comprises a nozzle group 751 composed of seventeen gas injection nozzles $731_1$ to $731_{17}$ optimized in configuration, and a chemical solution mist recovery unit 752 disposed at a position facing the nozzle group 751 across a slit 703a. Above the substrate edge, there is a chemical solution shielding mechanism 710b using gas.

The top plate 703 is opened when delivering or discharging the substrate 700. The top plate 703 may be opened either by a mechanism of moving the top plate 703 upward, or a mechanism of lowering the lower unit 701 including the substrate-mounting platform 702 for mounting the substrate 700.

While the chemical solution is supplied on the substrate 700, the rotational frequency of the substrate-mounting platform 702, the moving speed of the drive system (not shown) for driving the nozzle, and the chemical solution discharge speed from the chemical solution feed nozzle 122 are controlled respectively by a rotary drive control unit (not shown), a nozzle drive control unit (not shown), and a chemical solution feed pump (not shown). A controller (not shown) for supervising the three control units is disposed at the upstream side.

The process of applying an interlayer insulating film on the substrate 700 is explained.

The substrate-mounting platform 702 and lower unit 701 move downward and a space is formed against the top plate 703. In this space, the substrate 700 is delivered by a conveying arm (not shown). In succession, three pins (not shown) of the substrate-mounting platform 702 ascend to lift the substrate 700 from the conveying arm, and the conveying arm returns to outside of the unit. When the three pins descend, the substrate-mounting platform 702 and lower unit 701 are moved upward to contact with the top plate 703, and a closed space is formed. In the closed space, the narrow slit 703a is formed for supplying the chemical solution from the chemical solution feed nozzle 122.

While stopping the supply of chemical solution, the chemical solution feed nozzle 122 moves upward to the center of the substrate 700 corresponding to the chemical solution feed start position of the substrate 700. After starting injection of gas from the nozzle group 751 of the chemical solution partial shielding mechanism 750, discharge of chemical solution from the chemical solution feed nozzle 122 is started. The discharged chemical solution is conveyed to the chemical solution mist recovery unit by the gas stream preliminarily formed underneath. At this time, the chemical solution mist recovery unit adjusts the suction to recover the mist produced when the chemical solution collides against the gas. The sucked chemical solution is conveyed outside of the application apparatus through a waste liquid pipe.

Figure 18A:
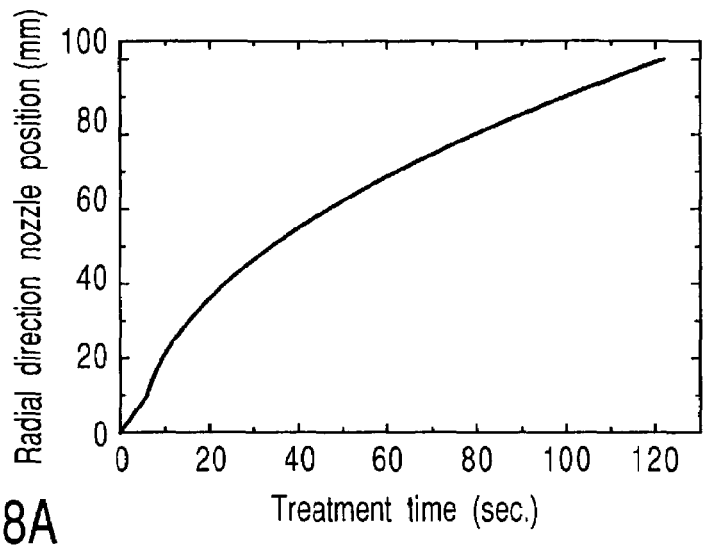
FIG. 18A is a graph showing the nozzle position from the center of the substrate with respect to the treatment time according to the sixth embodiment.
Figure 18B:
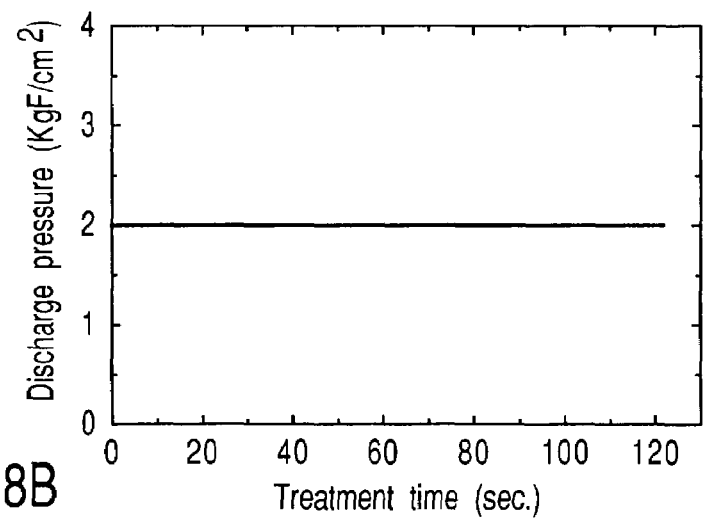
FIG. 18B is a graph showing the chemical solution discharge pressure form the center of the substrate with respect to the treatment time according to the sixth embodiment.
Figure 18C:
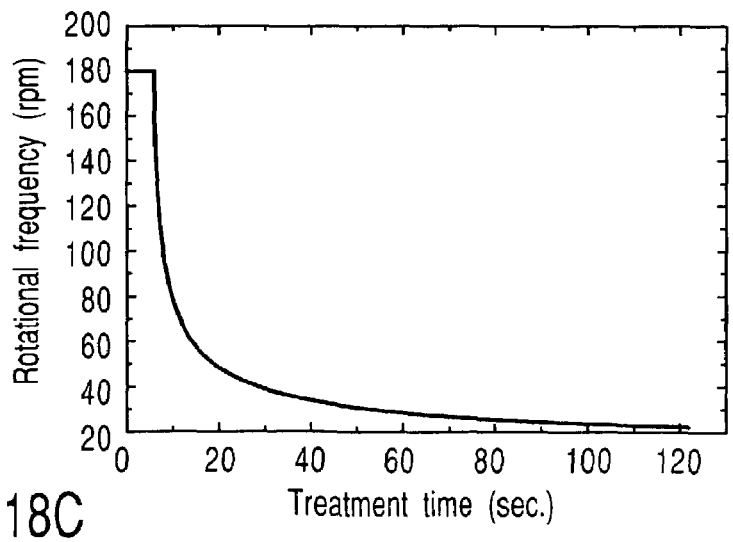
FIG. 18C is a graph showing the substrate rotational frequency from the center of the substrate with respect to the treatment time according to the sixth embodiment.

When discharge of chemical solution from the chemical solution feed nozzle 122 is stabilized, move of the chemical solution feed nozzle 122 is started according to the control shown in FIG. 18. FIG. 18A shows nozzle positions in the radial direction from the center of the substrate with respect to the process time, FIG. 18B shows the chemical solution discharge pressure with respect to the process time, and FIG. 18C shows the substrate rotational frequency with respect to the process time.

Up to 8.9 mm in radial direction from the center of the substrate 700, the rotational frequency of the substrate 700 is set at 180 rpm, the chemical solution discharge pressure is 2 kgF/cm², and the nozzle move pitch/revolution in the radial direction is 1.609 mm. The chemical solution feed nozzle 122 starts to move from the center of the substrate 700 toward the outer circumference. Within the shielding effective width of each gas injection nozzle, the chemical solution dropping from the chemical solution feed nozzle is changed in the dropping direction by the gas injection, and is conveyed to the chemical solution mist recovery unit. The chemical solution drops on the substrate in a region outside of the shielding effective width. By this operation, the chemical solution is shielded temporarily, and in a region within the diameter of 8.9 mm of the substrate, the dropped chemical solution spreads on the substrate, and drops contact with each other, and a uniform liquid film is formed. The process time from the center of the substrate to the diameter of 8.9 mm was about 5.89 sec.

After 5.89 sec. the rotational frequency is controlled while moving so that the radial move pitch of the chemical solution feed nozzle 122 may change in geometrical series every time the substrate 700 makes one revolution. Emission of gas from the nozzle group 751 was stopped when the liquid drop from the chemical solution feed nozzle has passed the shielding effective width of the final gas injection nozzle.

When the chemical solution feed nozzle 122 comes to the non-application region on the outer circumference of the substrate 700, the chemical solution shielding mechanism 710b positioned on the outer circumference is put in action. The chemical solution shielding mechanism 710b on the outer circumference is preliminarily disposed above the non-application region, and when the chemical solution supplied from the chemical solution feed nozzle comes into the shielding effective width of the gas injection nozzle 711b, the nozzle opening and closing control piezo unit 723 is immediately returned, and the trajectory of the chemical solution is changed so s to be collected in the mist recovery unit 724. At this position, the chemical solution feed nozzle 122 stops, and discharge of chemical solution is also stopped. When discharge of chemical solution from the chemical solution feed nozzle 122 is completely stopped, the nozzle opening and closing control piezo unit 723 is pushed out, and the flexible tube 721 is deformed and the gas injection is stopped. As the gas, for example, nitrogen, argon, helium or other inert gas may be used.

Further, the chemical solution feed nozzle 122 is moved away from above the top plate 703, and while moving downward the substrate-mounting platform 702 and lower unit 701, the substrate 700 is lifted by the three pins. Then, the conveying arm is carried into the produced gap, the three pins are lowered to put the substrate 700 on the conveying arm, and the substrate 700 is discharged by moving the conveying arm outside of the unit. Then the substrate-mounting platform 702 and lower unit 701 are moved upward, and stopped at specified position, thereby finishing the process.

Drying of the liquid film formed on the substrate 700 conforms to the fourth embodiment, and specific explanation is omitted.

In this embodiment, the gas injection nozzles are disposed at both ends and middle of the shielding unit, but the layout is not specified. For example, one may be disposed in a shielding unit. As shown in FIG. 19, when disposing the gas injection nozzle 761 in the middle of the shielding unit, the right side of the formula (30) may be modified to s/(D+W), and the gas injection nozzle 761 may be disposed at the obtained position $r_i$. Table 2 shows the configuration of the nozzles with the gas injection nozzle disposed in the middle of the shielding unit.

TABLE 2

| Nozzle No. | Shielding unit start point (mm) | Shielding unit end point (mm) | Central position of gas injection nozzle (mm) | Shielding effective unit (mm) | Position |
|---|---|---|---|---|---|
| 1 | 0.000 | 0.356 | 0.178 | 0.350 | Second stage |
| 2 | 0.356 | 0.727 | 0.542 | 0.350 | First stage |
| 3 | 0.727 | 1.113 | 0.920 | 0.350 | Second stage |
| 4 | 1.113 | 1.517 | 1.315 | 0.350 | First stage |
| 5 | 1.517 | 1.942 | 1.730 | 0.350 | Second stage |
| 6 | 1.942 | 2.392 | 2.167 | 0.350 | First stage |
| 7 | 2.392 | 2.870 | 2.631 | 0.350 | Second stage |
| 8 | 2.870 | 3.384 | 3.127 | 0.350 | First stage |
| 9 | 3.384 | 3.943 | 3.664 | 0.350 | First stage |
| 10 | 3.943 | 4.561 | 4.252 | 0.350 | First stage |
| 11 | 4.561 | 5.263 | 4.912 | 0.350 | First stage |
| 12 | 5.263 | 6.094 | 5.678 | 0.350 | First stage |
| 13 | 6.094 | 7.178 | 6.636 | 0.350 | First stage |
| 14 | 7.178 | 9.803 | 8.490 | 0.353 | First stage |

In this case, fourteen gas injection nozzles of outside diameter of 0.5 mm and inside diameter of 0.3 mm can be used. FIG. 20 shows an arrangement of fourteen gas injection nozzles. FIG. 20 is a diagram showing the layout of gas injection nozzles arranged in the configuration shown in Table 2. As shown in FIG. 20, gas injection nozzles $761_1$ to $761_{14}$ are arranged. In the fourteenth gas injection nozzle $761_{14}$, the shielding effective width must be broadened, but according to the method of determining the shielding effective width shown in Table 2, the gas pressure in the fourteenth gas injection nozzle $761_{14}$ was set higher than in the other nozzles. In Table 2, the central position of the gas injection nozzle was set in the center of the shielding unit, but it is not limited. A proper position may be selected anywhere between the start point and end point of the shielding unit. The width of the shielding unit (the distance from start point to end point) depends on the required outermost diameter $r_c$. This diameter $r_c$ also depends on the desired liquid film thickness and the properties of chemical solution (for example, solid content, viscosity, density, presence or absence of surface active agent), and therefore the position of gas injection nozzles should not be fixed preferably. On the basis of the coating condition, the value of $r_c$ is calculated or experimentally determined, and it is desired to have a mechanism for finely adjusting so as to be disposed according to the result. For fine adjustment, on a base of a shape memory alloy recording an elongation by specified temperature, for example, gas injection nozzles are disposed, and by adjusting the temperature between gas injection nozzles, a desired interval can be reproduced.

Instead of using gas injection nozzles for shielding the chemical solution, chemical solution shielding downspouts may be disposed between the chemical solution feed nozzle and the substrate. At this time, as for the position of the chemical solution shielding downspouts, when the chemical solution shielding downspouts are used instead of the gas injection nozzles in the shielding condition of Table 1 or 2, the width of the chemical solution shielding downspout may be set equal to the shielding effective width of gas injection nozzle, and the center of the downspout should coincide with the central position of gas injection nozzle. When using chemical solution shielding downspouts, flat layout is preferred. Even when using chemical solution shielding downspout, the shielding unit width (distance from start point to end point) also depends on the outermost diameter $r_c$ necessary for shielding the chemical solution. This diameter $r_c$ also depends on the desired liquid film thickness and the properties of chemical solution (for example, solid content, viscosity, density presence or absence of surface active agent), and therefore the position of shielding downspouts should not be fixed preferably.

On the basis of the coating condition, the value of the outermost diameter $r_c$ necessary for shielding the chemical solution is calculated or experimentally determined, and it is desired to have a mechanism for finely adjusting so as to be disposed according to the result. For fine adjustment, on a base of a shape memory alloy recording an elongation by specified temperature, for example, chemical solution shielding downspouts are disposed, and by adjusting the temperature between the shielding downspouts, a desired interval can be reproduced. Besides, when using chemical solution shielding downspouts, the chemical solution shielded by the chemical solution shielding downspouts may be likely to be solidified to be dust source. Therefore, when shielding the chemical solution, it is preferred to provide the application apparatus with a mechanism for passing the solvent contained in the chemical solution in the shielding downspouts, and conveying the shielded chemical solution promptly to the chemical solution recovery unit together with the solvent. By passing the solvent in the chemical solution shielding downspouts, precipitation of the solid matter contained in the chemical solution may be suppressed.

Preferably, the downspout is of two-layer structure as shown in FIG. 21, and the solvent should be passed in both upper layer and lower layer. FIG. 21 is a diagram schematically showing a configuration of chemical solution partial shielding mechanism composed of downspouts installed in upper layer and lower layer. A first shielding downspout 782 installed in the upper layer causes the solvent contained in the chemical solution to overflow slightly as the chemical solution 781 drops in. The solvent overflowing from the first shielding downspout 782 forms drops, which fall into a second shielding downspout 783 installed in the lower layer. The dropping solvent and chemical solution are collected in the second shielding downspout 783, and therefore it is possible to apply while keeping cleanliness without allowing sticking of the chemical solution 781 to the side wall of the first shielding downspout 782. In FIG. 21, the chemical solution 786 dropping on the substrate 785 is invading into the inside of the first shielding width 782 due to flowability. Shielding of chemical solution in this embodiment is adjustment of dropping amount by shielding the chemical solution. Therefore, the chemical solution 786 dropping on the substrate 785 invades, by flowability, into the region shielded by the first and second shielding downspouts 782, 783, and finally the chemical solutions are joined to form one liquid film. Further, by surface tension of the chemical solution, it is the aim of this embodiment to form a liquid film of a desired uniform thickness.

The invention is not limited to the illustrated embodiments, but may be changed and modified within the scope thereof in the practical stages. For example, in the embodiments, the chemical solution feed nozzle is moved from the inner periphery of the substrate to the outer periphery, but the chemical solution feed nozzle may be also moved from the outer periphery of the substrate to the inner periphery. In this case, the move pitch of the dropping unit in the radial direction occurring in one revolution of the substrate becomes larger gradually. The move pitch dR in the radial direction occurring in every revolution of the substrate is determined as the value of the product of the move pitch $d_{RO}$ immediately before multiplied by the change rate a' larger than 1.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a liquid film comprising:
   setting a first position at one end of a moving section of a dropping unit for dropping a chemical solution while moving in a radial direction from an inner periphery to an outer periphery on a rotating substrate;
   determining a chemical solution feed amount g0 per unit length of a trajectory of the chemical solution dropped on the substrate from the dropping unit to the substrate and a rotational frequency of the substrate when the dropping unit is positioned on the outermost diameter of a chemical solution supply region of the substrate;

setting a move pitch so that the move pitch of the dropping unit in a radial direction occurring at every revolution of the substrate decreases in a geometric progression in such a manner that a move pitch dR is calculated as a product of the move pitch dR0 immediately before being multiplied by a change rate a smaller than 1 when the dropping unit is present at an arbitrary position while lowering a rotational frequency of the substrate gradually;

determining a chemical solution feed speed and substrate rotational frequency from the dropping unit at the first position, the move pitch of the dropping unit at the first position, and the chemical solution feed amount g0;

calculating a second position where the dropping unit is located a unit time after the dropping unit is located at the first position from the rotational frequency when the substrate is rotated for the unit time from the time of the dropping unit located at the first position, and the move pitch of the dropping unit at the first position;

calculating the relation of the radial position of the dropping unit, chemical solution feed speed, and substrate rotational frequency with respect to the time, by setting the second position again as a new first position until the second position reaches the other end of the moving section, and repeating calculation of the chemical solution feed speed and substrate rotational frequency from the dropping unit at the first position, and calculation of the second position where the dropping unit is located in unit time; and forming a liquid film on the substrate by controlling the radial position of the dropping unit, chemical solution feed speed, and substrate rotational frequency on the basis of the calculated relation to form the liquid film of uniform thickness, wherein in a region where the chemical solution feed speed and substrate rotational frequency are out of the control limit, and the film thickness of the liquid film is larger than the desired film thickness, the chemical solution feed speed and substrate rotational frequency are controlled by condition at a radial position rc of the outermost circumference immediately before the film thickness increases, and the chemical solution discharged from the dropping unit is shielded at the shielding ratio C presented by the value of 1 divided by the product of 1/rc and r, at shielding position r of the dropping unit in the radial direction.

2. The method of forming a liquid film according to claim 1, wherein the chemical solution is shielded by the gas injected from gas injection nozzles disposed between the dropping unit and the substrate, and the layout of the gas injection nozzles is determined by setting the outside diameter D of at least one of the gas injection nozzle s, and the chemical solution effective shielding width s for shielding the chemical solution in the radial direction by the gas injected from one gas injection nozzle, determining the intermediate position ri so that the shielding ratio C may be equal to the value of the chemical solution effective shielding width s divided by a value two times the balance of subtracting the reference position p from the intermediate position ri of the shielding unit width P, with the reference position p taken at the chemical solution feed start position or the outermost circumference position for shielding the chemical solution, and determining the shielding unit width P on the basis of the determined intermediate position ri, determining the intermediate position ri and shielding unit width P while setting a new reference position at a position corresponding to the determined shielding unit width P, from the chemical feed start position to the outermost peripheral position for shielding the chemical solution, or from the outermost peripheral position for shielding the chemical solution to the chemical solution feed start position, and determining the configuration position of the gas injection nozzles on the basis of the determined results of the shielding unit width P and intermediate position ri.

3. The method of forming a liquid film according to claim 2, wherein the chemical solution effective shielding width is adjusted by at least changing the inside diameter of the gas injection nozzle or the gas pressure.

4. The method of forming a liquid film according to claim 2, wherein the gas is an inert gas.

5. The method of forming a liquid film according to claim 2, wherein the position of the gas injection nozzle is finely adjusted depending on the substrate coating condition.

6. The method of forming a liquid film according to claim 2, wherein the chemical solution effective shielding width s is set at a sufficient width for mutually connecting the adjacent liquid supplied on the substrate without being shielded by chemical solution shielding, by the flowability of the liquid on the substrate.

7. The method of forming a liquid film according to claim 1, wherein the chemical solution is shielded by shielding downspouts disposed between the dropping unit and the substrate, and the layout of the shielding downspouts is determined by setting the width s of the shielding downspouts in the radial direction, determining the intermediate position ri so that the shielding rate C may be equal to the value of the chemical solution effective shielding width s divided by a value two times the balance of subtracting the reference position p from the intermediate position ri of the shielding unit width P, with the reference position p taken at the chemical solution feed start position or the outermost circumference position for shielding the chemical solution, and determining the shielding unit width P on the basis of the determined intermediate position ri, determining the intermediate position ri and shielding unit width P while setting a new reference position at a position corresponding to the determined shielding unit width P, from the chemical feed start position to the outermost peripheral position for shielding the chemical solution, or from the outermost peripheral position for shielding the chemical solution to the chemical solution feed start position, and determining the configuration position of the shielding downspouts on the basis of the determined results of the shielding unit width P and intermediate position ri.

8. The method of forming a liquid film according to claim 7, wherein the solvent contained in the liquid is passed in the shielding downspouts when shielding the chemical solution, and transporting the liquid shielded by the shielding downspouts to a liquid discard unit together with the solvent.

9. The method of forming a liquid film according to claim 7, wherein the shielding downspouts include a first shielding downspout of which width in the radial direction is nearly equal to the width s of the shielding downspout, and a second shielding downspout provided beneath the first shielding downspout of which width in the radial direction is shorter than the width of the first shielding downspout, and the chemical solution is shielded by the first shielding downspout, and the chemical solution overflowing from the first shielding downspout is collected in the second shielding downspout without overflowing on the substrate, and the collected liquid is transported to the liquid discard unit.

10. The method of forming a liquid film according to claim 9, wherein the solvent contained in the liquid dropped from the dropping unit is passed into the second downspout at the time of shielding the chemical solution, and the liquid collected in the second shielding downspout is transported to the liquid discard unit together with the solvent.

11. The method of forming a liquid film according to claim 9, wherein the first shielding downspout is filled with the solvent contained in the liquid dropped from the dropping unit at the time of shielding the chemical solution.

12. The method of forming a liquid film according to claim 11, wherein the solvent contained in the liquid dropped from the dropping unit is passed in the second downspout at the time of shielding the chemical solution, and the liquid collected from the second shielding downspout is transported to the liquid discard unit together with the solvent.

13. The method of forming a liquid film according to claim 7, wherein the position of the shielding downspout is finely adjusted depending on the substrate coating condition.

14. The method of forming a liquid film according to claim 7, wherein the chemical solution effective shielding width s is set at a sufficient width for mutually connecting the adjacent liquids supplied on the substrate without being shielded by chemical solution shielding, by the flowability of the liquid on the substrate.

15. The method of forming a liquid film according to claim 1, wherein in a region where the chemical solution feed speed and substrate rotational frequency are out of the control limit, and the liquid film thickness is larger than the desired film thickness, the movement of the dropping unit is nearly equal to the move pitch at the radial position of the outermost circumference where the liquid thickness begins to increase.

* * * * *

UNITED STATES PATENT AND TRADEMARK OFFICE
CERTIFICATE OF CORRECTION

PATENT NO. : 7,371,434 B2 Page 1 of 1
APPLICATION NO. : 10/202657
DATED : May 13, 2008
INVENTOR(S) : Ito It is certified that error appears in the above-identified patent and that said Letters Patent is hereby corrected as shown below:

Claim 1, column 30, line 62, change "g0" to --q0--.

Claim 7, column 32, line 44, change "circumference" to --circumferential--.

Signed and Sealed this

Twelfth Day of August, 2008

JON W. DUDAS
*Director of the United States Patent and Trademark Office*

UNITED STATES PATENT AND TRADEMARK OFFICE
CERTIFICATE OF CORRECTION

PATENT NO.         : 7,371,434 B2                                              Page 1 of 1
APPLICATION NO. : 10/202657
DATED              : May 13, 2008
INVENTOR(S)        : Shinichi Ito It is certified that error appears in the above-identified patent and that said Letters Patent is hereby corrected as shown below:

On the Title page,

[*] Notice:    Subject to any disclaimer, the term of this patent is extended or adjusted under 35 USC 154(b) by (92) days Delete the phrase "by 92 days" and insert -- by 63 days --

Signed and Sealed this

Twenty-first Day of July, 2009

JOHN DOLL
*Acting Director of the United States Patent and Trademark Office*